United States Patent
Nishimura

(10) Patent No.: US 9,601,440 B2
(45) Date of Patent: Mar. 21, 2017

(54) METHOD FOR MANUFACTURING SEMICONDUCTOR DEVICE AND EXPOSURE MASK USED IN THE SAME METHOD

(71) Applicant: FUJI ELECTRIC CO., LTD., Kawasaki-shi (JP)

(72) Inventor: Takeyoshi Nishimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 115 days.

(21) Appl. No.: 14/219,661

(22) Filed: Mar. 19, 2014

(65) Prior Publication Data

US 2014/0287568 A1    Sep. 25, 2014

(30) Foreign Application Priority Data

Mar. 19, 2013   (JP) .................. 2013-055980

(51) Int. Cl.
*G03F 1/38* (2012.01)
*H01L 23/00* (2006.01)
(Continued)

(52) U.S. Cl.
CPC .............. *H01L 23/562* (2013.01); *G03F 1/38* (2013.01); *H01L 21/78* (2013.01); *H01L 23/3171* (2013.01); *H01L 2924/0002* (2013.01)

(58) Field of Classification Search
CPC ..... H01L 21/32139; H01L 2223/54426; H01L 23/544; H01L 21/0274;
(Continued)

(56) References Cited

U.S. PATENT DOCUMENTS 4,849,313 A * 7/1989 Chapman ............... G03F 1/14
355/53
4,967,229 A * 10/1990 Akutagawa ........... H01L 21/268
257/E21.347

(Continued)

FOREIGN PATENT DOCUMENTS

JP    01-260451 A    10/1989
JP    02-135343 A    5/1990
(Continued)

OTHER PUBLICATIONS

Office Action issued in Japanese Appln. No. 2013-055980, mailed Dec. 6, 2016. English translation provided.

*Primary Examiner* — Bac Au
(74) *Attorney, Agent, or Firm* — Rossi, Kimms & McDowell LLP

(57) ABSTRACT

A method for manufacturing a semiconductor device is disclosed in which the probability of occurrence of a crack is reduced and in which manufacturing cost is also reduced. An exposure mask used in the method is disclosed. Protrusion portions are formed in intersections of scribe lines in an outermost periphery of a scribe line pattern of a surface protection film of the exposure mask, to thereby stick out toward an outer circumference. In this manner, the probability of occurrence of a crack occurring in a device formation section can be reduced so that a reduction in the manufacturing cost can be achieved.

3 Claims, 21 Drawing Sheets

(51) Int. Cl.
*H01L 21/78* (2006.01)
*H01L 23/31* (2006.01)

(58) Field of Classification Search
CPC ... H01L 2223/54453; H01L 2223/5446; G03F 7/70625
See application file for complete search history.

(56) References Cited

U.S. PATENT DOCUMENTS

| | | | | |
|---|---|---|---|---|
| 5,285,259 | A * | 2/1994 | Saitoh | G03F 9/7084 356/401 |
| 5,789,120 | A * | 8/1998 | Jang | G03F 1/144 430/5 |
| 6,747,337 | B1 * | 6/2004 | Yamamoto | H01L 23/544 257/620 |
| 7,709,295 | B2 * | 5/2010 | Fujimura | H01L 21/304 257/E21.459 |
| 8,778,779 | B2 * | 7/2014 | Naoe | H01L 21/0274 250/559.3 |
| 2001/0041412 | A1 | 11/2001 | Takasu | |
| 2002/0033504 | A1 | 3/2002 | Ohnakado | |
| 2002/0111028 | A1 | 8/2002 | Arima et al. | |
| 2006/0046435 | A1 | 3/2006 | Kida | |
| 2006/0097356 | A1 * | 5/2006 | Fujii | H01L 21/78 257/620 |
| 2006/0227126 | A1 | 10/2006 | Kawagoshi | |
| 2008/0185678 | A1 | 8/2008 | Kitajima | |

FOREIGN PATENT DOCUMENTS

| | | |
|---|---|---|
| JP | 04192329 A | 7/1992 |
| JP | 2944573 B2 | 6/1999 |
| JP | 2000-133778 A | 5/2000 |
| JP | 2001-320019 A | 11/2001 |
| JP | 2002-100761 A | 4/2002 |
| JP | 2002-246281 A | 8/2002 |
| JP | 2003-110029 A | 4/2003 |
| JP | 2004-146487 A | 5/2004 |
| JP | 2004363517 A | 12/2004 |
| JP | 2006-073779 A | 3/2006 |
| JP | 2006-294903 A | 10/2006 |
| JP | 2007027324 A | 2/2007 |
| JP | 2008103433 A | 5/2008 |
| JP | 2008-192986 A | 8/2008 |
| JP | 2013-007619 A | 1/2013 |

\* cited by examiner

PRESSURE WITHSTANDING
STRUCTURE

PRESSURE WITHSTANDING STRUCTURE

METHOD FOR MANUFACTURING SEMICONDUCTOR DEVICE AND EXPOSURE MASK USED IN THE SAME METHOD

BACKGROUND OF THE INVENTION

A. Field of the Invention

This invention relates to a method for manufacturing a semiconductor device, which method includes a step of cutting a wafer with a dicing blade, and an exposure mask used in the same method.

B. Description of the Related Art

A step of manufacturing a semiconductor device may include a step of cutting a wafer with a dicing blade along scribe lines formed in a surface protection film. In this step, cutting is often done where no scribe lines are formed in an outer circumferential portion of the wafer. The step concerned with the cutting of the wafer will be described.

FIG. 16 is a main part plan view of reticle 51 for forming scribe lines. Reticle 51 is a reduced exposure mask, which has a plurality of device formation sections 52. The case where four device formation sections 52 are formed is shown in FIG. 16. Device formation sections 52 are separated from one another by scribe line pattern 53. Scribe line pattern 53 includes scribe lines 54 surrounding device formation sections 52 and scribe lines 54 arranged in a grid pattern and for separating adjacent ones of device formation sections 52 from each other.

FIG. 17 is a main part plan view of proximity exposure mask 57 for forming scribe lines. Proximity exposure mask 57 is a mask with which the whole region of wafer 1 can be exposed to light at one-time exposure so as to pattern a metal film, a surface protection film, etc. formed on wafer 58 (not-shown).

Thus, in a background-art exposure mask such as reticle 51 in FIG. 16 or proximity exposure mask 57 in FIG. 17, no protrusion portion 56 (designated by the broken line) of a scribe line is formed to stick out toward an outer circumference from intersection 55 of outermost peripheral scribe lines 54.

FIG. 18 is a plan view of scribe line pattern 62 when resist 61 on wafer 1 is exposed to light by use of reticle 51.

Wafer 1 is moved back and forth and left and right stepwise during exposure. Whenever wafer 1 is stopped, resist 61 of wafer 1 is exposed to light repeatedly. At one-time exposure on this occasion, resist 61 is exposed to light with a reduced pattern of reticle 51 so that the scribe line pattern of reticle 51 can be transferred to resist 61. When such exposure is repeated, scribe line pattern 62 is formed in the resist on wafer 1. Here, one-time exposure will be referred to as one shot. A pattern formed in resist 61 by this shot will be referred to as one-shot pattern 63. The number of shots for wafer 1 having a large diameter reaches about several ten. When each shot area is reduced, the number of shots reaches several hundred in order to form devices all over the surface of the wafer.

When, for example, reticle 51 is used, resist 61 is exposed to light to form scribe line pattern 62 in which adjacent ones of one-shot patterns 63 overlap each other in outermost peripheral scribe lines 64. Surface protection film 71 is etched by use of scribe line pattern 62 of resist 61 so that scribe line pattern 72 (not shown) is formed in surface protection film 71 (not-shown). Each region enclosed by the thick broken line designates an area of one-shot pattern 63. In FIG. 18, two one-shot patterns 63 formed in resist 61 are designated by the thick broken line. FIG. 18 shows a state in which two one-shot patterns 63 overlap each other in the outermost peripheral scribe lines 64 forming one-shot patterns 63. In order to increase the number of device formation sections 74, one-shot patterns 63 are formed to partially protrude from wafer 1 in the outer circumferential portion. In FIG. 18, one-shot patterns 63 protrude on the upper side, the right side and the lower left side.

In addition, each circle 66 in FIG. 18 designates a place where a crack (including chip) occurs easily when wafer 1 is cut along scribe line 73 formed in surface protection film 71. An arrow E indicates a cutting direction. Here, the term "chip" means a flaw such as a notch or a crack occurring in the range of from a dicing end surface to the inside of a die due to the dicing.

FIG. 19 is a plan view of scribe line pattern 62 when resist 61 on wafer 1 is exposed to light by use of proximity exposure mask 9. Scribe lines 64 are formed not to protrude from wafer 1. Also in this case, circle 66 in FIG. 19 indicates a place where a crack (including chip) occurs easily when wafer 1 is cut. In addition, an arrow E indicates a cutting direction.

FIG. 20 is a main part perspective view in which a portion F of scribe line pattern 62 formed in resist 61 shown in FIG. 18 or FIG. 19 is viewed from the direction of an arrow G. Each scribe line 64 is formed to be interposed between side walls of resist 61. Surface protection film 71 is exposed over scribe line 64.

FIG. 21 is a main part perspective view of scribe line pattern 72 of surface protection film 71 formed by use of scribe line pattern 62 of resist 61 in FIG. 18 or FIG. 19. Each scribe line 73 is interposed between side walls of surface protection film 71. Each of side walls 71a of surface protection film 71 is at a distance of about 10 μm from corresponding one of end portions 74a of device formation sections 74. In addition, the same metal film as metal film 75 formed in each device formation section 74 is often formed under surface protection film 71 outside the outermost peripheral scribe lines 73. The front surface (silicon surface) of wafer 1 is exposed over the scribe lines 73.

In addition, dicing blade 76 designated by the broken line moves along scribe line 73 in the direction of an arrow H from the far side toward the near side. Surface protection film 71 is normally made of polyimide etc. and metal film 75 made of an aluminum silicon alloy etc. is provided as an undercoat.

FIG. 22 is a main part perspective view showing a state in which wafer 1 is cut along scribe line 73 with dicing blade 76. FIG. 22 shows the state in which wafer 1 is cut along scribe line 73 with dicing blade 76 in such a manner that dicing blade 76 making turn 79 is moved in the direction of arrow 78 from the left side of scribe line 73 toward the right side thereof. Scribe lines 73 (partially designated by the broken lines) orthogonal to scribe lines 73 extending in the left/right direction are formed. Wafer 1 is cut along orthogonal scribe lines 73 from the far side toward the near side. Thus, dies are formed.

Scribe line pattern 72 of surface protection film 71 shown in FIG. 21 and formed by use of the resist mask shown in FIG. 18 has the following problem during the cutting. That is, crack 77 may often occur and become a defect in a device formation section 74 (a device formation section adjacent to outermost peripheral scribe lines 73) in the vicinity of intersection 80 corresponding to each circle 66 in FIG. 18. Dicing blade 76 enters from the left side and moves toward the right side while rotating as described above. In addition, dicing blade 76 moves from the far side toward the near side. The place where crack 77 has occurred is device formation section 74 disposed adjacently to the intersection 80 of the outermost peripheral scribe lines 73.

Next, a mechanism in which crack 77 occurs at the time of cutting wafer 1 will be described.

FIGS. 23A to 23C are views for inferring and explaining the mechanism in which crack 77 occurs at the time of cutting. FIG. 23A is a view in which cutting surface protection film 71 (including metal film 200) has been started. FIG. 23B is a view at a moment when a front end portion of dicing blade 76 reaches scribe line 73. FIG. 23C is a view in which dicing blade 76 is moving along scribe line 73. FIGS. 23A to 23C are views showing the vicinity of intersection 80 of the outermost peripheral scribe lines 73. Scribe lines 73 intersect each other in a T-shape.

In FIG. 23A to FIG. 23B, the front end portion of dicing blade 76 touches surface protection film 71 (also including metal film 200 as an undercoat) and moves while cutting surface protection film 71. On this occasion, micro vibration 81 occurs in dicing blade 76 moving while cutting surface protection film 71 (also including metal film 200 as the undercoat), as shown in FIG. 24. This vibration 81 is transmitted to surface protection film 71 and wafer 1 under surface protection film 71 (also including metal film 200 as the undercoat). Stress is applied to surface protection film 71 (also including metal film 200 as the undercoat) and wafer 1. When the stress increases, crack 77 (including chip) occurs in wafer 1.

In FIG. 23B to FIG. 23C, crack 77 occurring in wafer 1 is in progress due to the aforementioned stress. Since the moment of FIG. 23B, the front end portion of dicing blade 76 does not touch surface protection film 71. Accordingly, the aforementioned stress decreases as dicing blade 76 moves along scribe line 73. That is, as dicing blade 76 moves away from the place where dicing blade 76 has touched surface protection film 71, the aforementioned stress decreases so that extension of crack 77 decreases.

The aforementioned stress generated when dicing blade 76 touches surface protection film 71 almost disappears in a place ahead of about 100 µm from end portion 73a of scribe line 73 (the probability of occurrence of crack 77 in that place is in the order of about 0.1%). Accordingly, the width W of each scribe line 73 is set at about 100 µm.

FIG. 25 is a main part sectional view showing a state in which wafer 1 is cut with dicing blade 76 which moves to pass through surface protection film 71 and undercoat metal film 75 in an outer circumferential portion of wafer 1 where no scribe line 73 is formed. Surface protection film 71 and metal film 75 are located in a place to be cut with dicing blade 76. Dicing blade 76 touches surface protection film 71 and metal film 75 so that micro vibration 81 occurs in dicing blade 76. Crack 77 occurs in wafer 1 due to stress generated by vibration 81. This crack 77 extends to device formation section 74.

In addition, a reticle in which an exposure film is extended to an end portion of a main die has been described, for example, in FIG. 1 of JP-A-2-135343.

Moreover, JP-A-1-260451 has described that a dedicated reticle for scribe lines is used so as not to leave an unnecessary pattern in scribe lines in an outer circumferential portion of a wafer.

In addition, a method using a negative resist so as not to leave a conductive film in an outermost circumferential region has been described in JP-A-2002-246281.

As described above, a crack may occur with a certain probability even in a place where dicing blade 76 has moved over a distance of 100 µm along scribe line 73. Therefore, recently, there has been a strong demand to reduce the probability of occurrence of crack 77 (also including chip) to be lower than the current probability to improve the yield rate to thereby achieve reduction in the cost. Particularly in an automotive semiconductor element, it is necessary to reduce the percent defective extremely to the order of ppm or below. The following method is conceivable as a solution to the aforementioned problem.

FIG. 26 is a view showing a state in which wafer 1 is exposed to light up to its outer circumference by use of reticle 51. When scribe lines 73 are formed thus all over the outer circumferential portion, dicing blade 76 can cut wafer 1 without touching surface protection film 71 or undercoat metal film 75. Therefore, the probability of occurrence of a crack 77 can be reduced extremely.

However, an increase in the number of times of exposure (the number of shots) leads to lowering of the capability of an exposure apparatus. Thus, the processing time is elongated to increase the manufacturing cost.

In addition, when scribe lines 73 are formed up to the outer circumferential portion of wafer 1 as shown in FIG. 26, the probability that a die (which is originally a bad die) including a pattern defect which cannot be eliminated by visual inspection is determined as a good die to be assembled may increase so that concern remains in the reliability of a semiconductor device.

In addition, even when scribe line pattern 72 is formed in a surface protection film by use of the aforementioned reticle 51 or the aforementioned proximity exposure mask 57 according to the background art, there is a possibility that crack 77 (including chip) may be introduced into a device formation section 74 in an outer circumferential portion as soon as wafer 1 is cut. It is therefore essential to execute visual inspection. However, it is almost impossible to perfectly eliminate bad dies by visual inspection. For this reason, visual inspection is not performed on any device formation section in the outer circumferential portion of wafer 1 which is anticipated as a site where a bad die may occur, but all dies located in that site are regarded as bad. However, since there is a possibility that non-defective dies may be eliminated as defective dies in this method, there is a possibility that the yield rate may decrease to increase the manufacturing cost.

SUMMARY OF THE INVENTION

In order to solve the foregoing problem, the present invention provides a method for manufacturing a semiconductor device in which the manufacturing cost can be reduced due to the reduced probability of occurrence of a crack, and an exposure mask used in the same method.

There is provided an exposure mask in which a scribe line pattern is drawn, wherein the scribe line pattern has protrusion portions each extending further on the outer circumferential side of an intersection of two scribe lines in an outermost periphery of the scribe line pattern.

In addition, preferably, the exposure mask in the first configuration of the invention may be arranged so that the length of each of the protrusion portions is not smaller than a value obtained by multiplying 100 µm by magnification of the mask.

In addition, preferably, the exposure mask in the first or second configuration of the invention may be arranged so that the length of each of the protrusion portions is not larger than a value obtained by multiplying 500 µm by magnification of the mask.

In addition, preferably, the exposure mask in any one of the first to third configurations of the invention may be arranged so that the exposure mask is a reticle or a proximity exposure mask.

In addition, there is provided a method for manufacturing a semiconductor device, having a step of cutting a semiconductor wafer along scribe lines with a dicing blade, the method including: a transferring step of transferring a scribe line pattern to a resist applied onto a surface layer of a surface protection film covering the semiconductor wafer, by use of an exposure mask in which the scribe line pattern has been drawn; a development step of selectively removing a portion of the resist corresponding to the scribe line pattern by development; an etching step of selectively etching a portion of the surface protection film corresponding to the scribe line pattern from which the resist has been removed, with the resist as a mask to thereby form scribe lines; and a cutting step of cutting the insides of the scribe lines along the scribe lines with a dicing blade to thereby divide the semiconductor wafer into dies; wherein: the exposure mask has one die pattern or a plurality of die patterns; the scribe line pattern drawn in the exposure mask has protrusion portions each extending further on the outer circumferential side of a corresponding intersection of two of the scribe lines in an outermost periphery of the scribe line pattern; the protrusion portions are transferred to the resist in the outermost periphery of the scribe line pattern on the semiconductor wafer by the transferring step; the portion of the resist corresponding to the scribe line pattern having the protrusion portions is selectively removed by the development step; the surface protection film under the portion corresponding to the scribe line pattern having the protrusion portions is selectively etched by the etching step so that scribe lines in which protrusion removal portions are formed are formed in the surface protection film under the protrusion portions; and the semiconductor wafer on the inner side of the protrusion removal portions of the scribe lines is cut along the protrusion removal portions of the scribe lines by the cutting step.

In addition, preferably, the method for manufacturing a semiconductor device in the fifth configuration of the invention may be arranged so that the length of each of the protrusion removal portions is not shorter than 100 μm.

In addition, according to a seventh configuration of the invention, preferably, the method for manufacturing a semiconductor device in the fifth or sixth configuration of the invention may be arranged so that the length of each of the protrusion removal portions is not longer than 500 μm.

In addition, preferably, the method for manufacturing a semiconductor device in any one of the fifth to seventh configurations of the invention may be arranged so that the surface protection film is made of polyimide.

In addition, according to a ninth configuration of the invention, preferably, the method for manufacturing a semiconductor device in any one of the fifth to eighth configurations of the invention may be arranged so that a metal film is provided as an undercoat of the surface protection film.

In addition, preferably, the exposure mask used in the method for manufacturing a semiconductor device in any one of the fifth to ninth configurations of the invention may be a reticle or a proximity exposure mask.

According to the invention, protrusion portions are formed in intersections of outermost peripheral scribe lines in a scribe line pattern of a surface protection film to thereby stick out toward an outer circumference. In this manner, the probability of occurrence of a crack occurring in a device formation section can be reduced, the defect rate can be reduced satisfactorily, and reduction in the manufacturing cost can be achieved.

BRIEF DESCRIPTION OF THE DRAWINGS

The foregoing advantages and features of the invention will become apparent upon reference to the following detailed description and the accompanying drawings, of which:

FIGS. 9A and 9B are views for explaining a surface element structure 120 in FIG. 1, in which FIG. 9A is a main part sectional view of surface element structure 120 formed in the vicinity of a wafer end portion and FIG. 9B is a main part plan view of wafer 1;

FIGS. 10A and 10B are main part plan views of an exposure mask used in the step of FIG. 3, in which FIG. 10A is a main part plan view of reticle 8 and FIG. 10B is a main part plan view of proximity exposure mask 9;

FIGS. 11A and 11B are views in which resist scribe line pattern 10 is formed in resist 4 on wafer 1 in the step of FIG. 4, in which FIG. 11A is a main part plan view and FIG. 11B is a main part perspective view seen from the direction of an arrow B in a portion A in FIG. 11A;

FIGS. 12A and 12B are views in which protection film scribe line pattern 17 is formed in surface protection film 3 on wafer 1 in the step of FIG. 5, in which FIG. 12A is a main part plan view and FIG. 12B is a main part perspective view seen from the direction of an arrow D in a portion C in FIG. 12A;

FIGS. 14A and 14B are views showing a scribe line pattern of reticle 8, in which FIG. 14A is a view in the case where the length L3 of each protrusion portion is short and FIG. 14B is a view in the case where the length L3 of each protrusion portion is long;

FIG. 19 is viewed from the direction of an arrow G;

FIGS. 23A to 23C are views for inferring and explaining a mechanism where crack 77 occurs at the time of cutting, in which FIG. 23A is a view in which cutting surface protection film 71 has been started, FIG. 23B is a view at a moment when a front end portion of dicing blade 76 reaches scribe line 73, and FIG. 23C is a view in which dicing blade 76 is moving along scribe line 73;

DETAILED DESCRIPTION OF SPECIFIC EMBODIMENTS

Embodiment 1

A method for manufacturing a semiconductor device according to Embodiment 1 of the invention will be described.

FIG. 1 to FIG. 8 are main part manufacturing step views showing a sequence of steps of the method for manufacturing a semiconductor device according to an embodiment of the invention. These manufacturing step views are sectional views taken along a line X2-X2 in FIG. 9B. Examples of the semiconductor device include a diode, a BJT (Bipolar Transistor), a MOSFET (MOS Field-Effect Transistor), an IGBT (Insulated Gate Bipolar Transistor), a thyristor, an IC (Integrated Circuit), etc.

Figure 1:
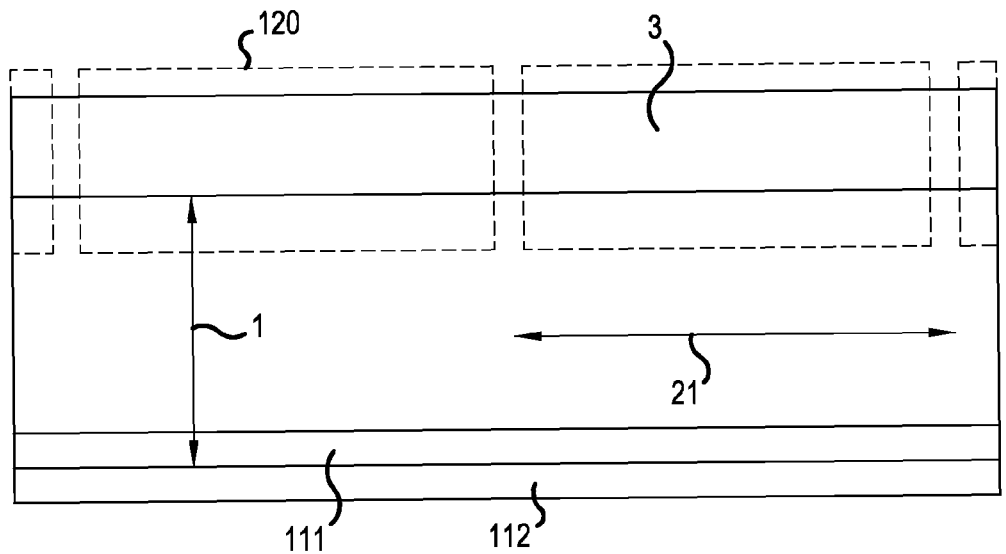
FIG. 1 is a main part manufacturing step view of a semiconductor device according to an embodiment of the invention.
Figure 9A:
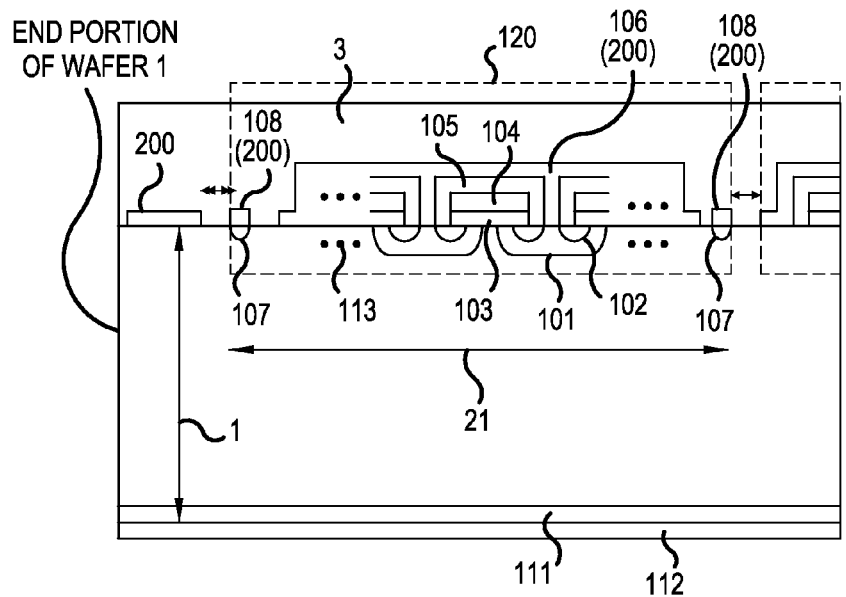
Figure 9B:
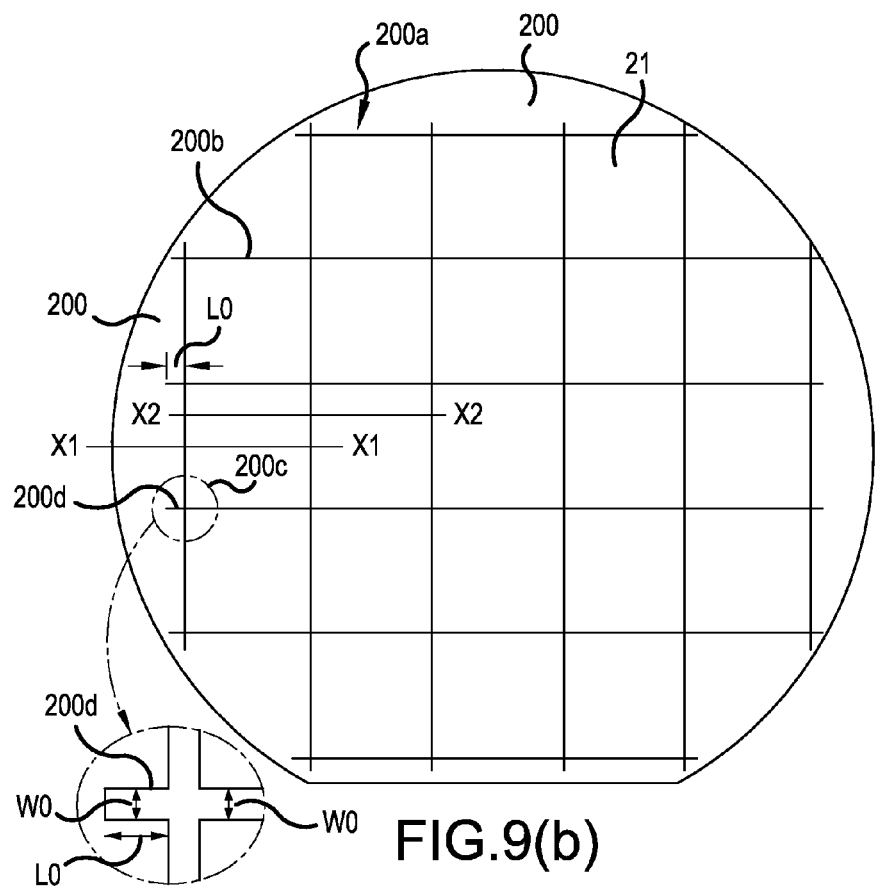

In the step of FIG. 1, various diffusion layers are formed in device formation section 21 on the front side of wafer 1 as shown in FIGS. 9A and 9B in order to form a large number of elements (devices) in wafer 1. Further, a metal film such as an electrode, insulating films (interlayer insulating film 105, gate insulating film 103 and a not-shown field oxide film, etc.) and surface protection film 3 are formed thereon so that surface element structure 120 is formed. In addition, diffusion layer 111 and back electrode 112 are formed on the back side of wafer 1. In the step, scribe lines 200b have been formed in metal film 200 forming electrodes etc., but protection film scribe line pattern 17 has not been formed yet in surface protection film 3 made of polyimide etc.

Metal film 200, the insulating films, etc. which are not shown are formed in the inside of surface protection film 3. In addition, metal film 200 (for example, the material thereof is an aluminum silicon alloy) shown in FIGS. 9A and 9B has a thickness of several μm. Protrusion portions 200d (with a length L0) each protruding from corresponding one of intersections 200c of outermost peripheral scribe lines 200b toward an outer circumference are formed in a scribe line pattern 200a formed in metal film 200. The length L0 of each protrusion portion 200d is about 10 μm longer than length L3 which will be described later. In addition, the width W0 of each scribe line 200b is about 10 μm wider than width W which will be described later (the width W0 may be equal to the width W in some cases). In addition, reference numeral 21 in FIG. 1 designates a device formation section.

FIGS. 9A to 9B are views for explaining surface element structure 120 in FIG. 1. FIG. 9A is a main part sectional view of surface element structure 120 formed in the vicinity of a wafer end portion. FIG. 9B is a main part plan view of wafer 1. FIG. 9A is the main part sectional view cut along a line X2-X2 in FIG. 9B. In addition, each scribe line is depicted as a straight line in FIG. 9B. Incidentally, reference numerals indicated in FIGS. 9A and 9B apply to the case of an IGBT (Insulated Gate Bipolar Transistor). Reference numeral 101 designates a well region; 102, an emitter region; 103, a gate insulating film; 104, a gate electrode; 105, an interlayer insulating film; 106, an emitter electrode; 107, a stopper region; 108, a stopper electrode; 3, a surface protection film; 120, a surface element structure; 111, a diffusion layer (collector layer); 112, a back electrode (collector electrode); and 21, a device formation section. Emitter electrode 106 and stopper electrode 108 are made of the aforementioned metal film 200. In addition, dot marks 113 in FIG. 9A indicate that well regions 101 exist successively.

Figure 2:
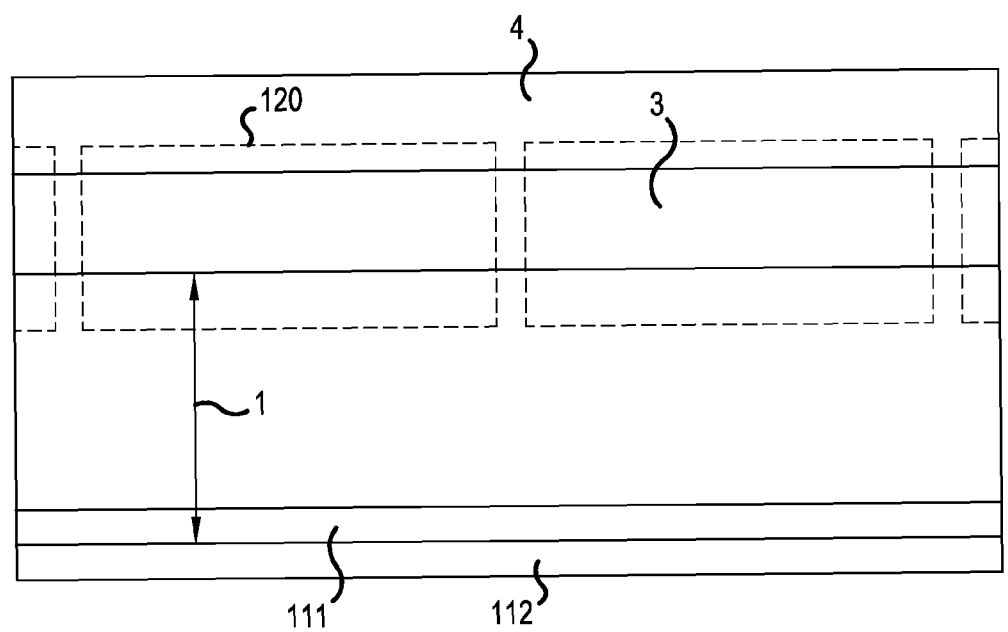
FIG. 2 is a main part manufacturing step view of the semiconductor device according to the embodiment of the invention, following FIG. 1.

Surface protection film 3 is covered with resist 4 in the step of FIG. 2. Next, in order to form resist scribe line pattern 10 in resist 4, resist 4 is exposed to light by use of an exposure mask so that resist scribe line pattern 10 is transferred to resist 4 (exposed portions 10b) in the step of FIG. 3. The exposure mask is reticle 8 or proximity exposure mask 9. In addition, a scribe line pattern having protrusion portions 7 extending from intersections 6 of outermost peripheral scribe lines 5 in FIGS. 10A and 10B toward the outer circumference is drawn in the exposure mask.

Figure 4:
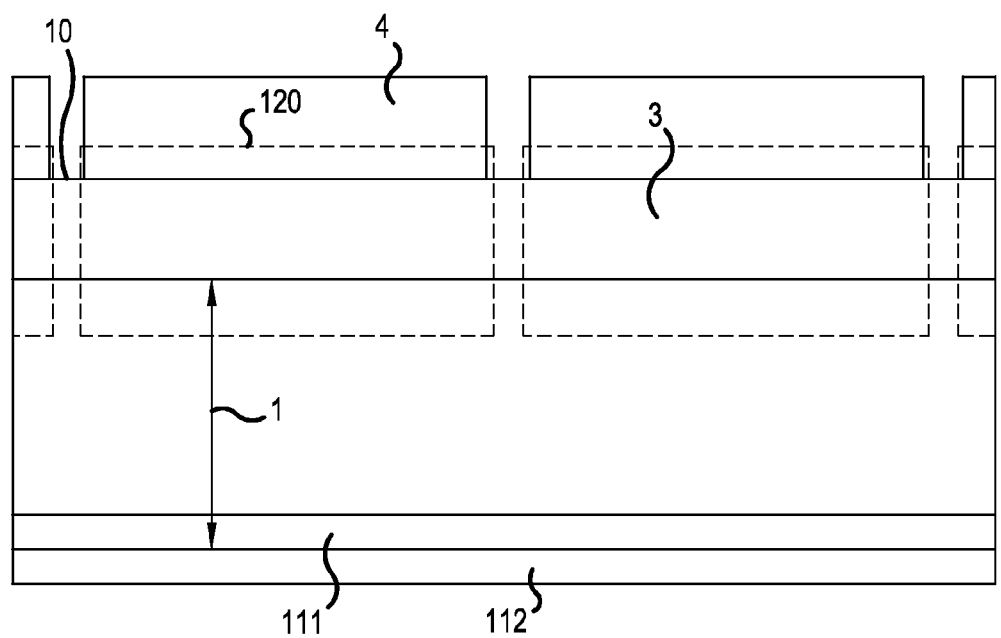
FIG. 4 is a main part manufacturing step view of the semiconductor device according to the embodiment of the invention, following FIG. 3.
Figure 11A:
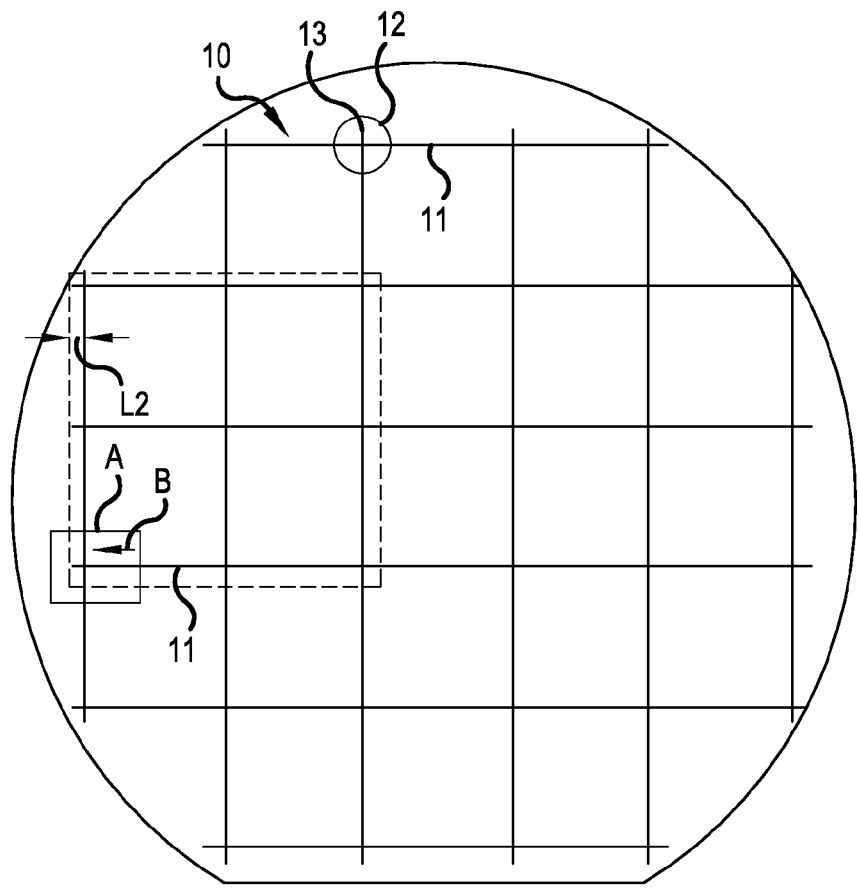
Figure 11B:
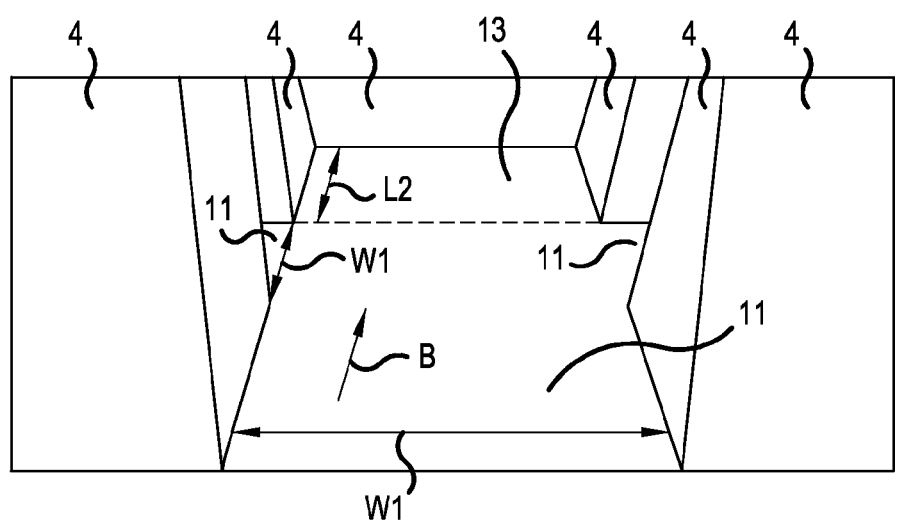

In the step of FIG. 4, the exposed resist 4 is developed so that resist 4 is selectively removed in such a manner that portions of resist scribe line pattern 10 having protrusion portions 13 protruding toward the outer circumference from intersections 12 of outermost peripheral scribe lines 11 shown in FIGS. 11A and 11B are opened. In this manner, resist scribe line pattern 10 is formed in resist 4.

Figure 5:
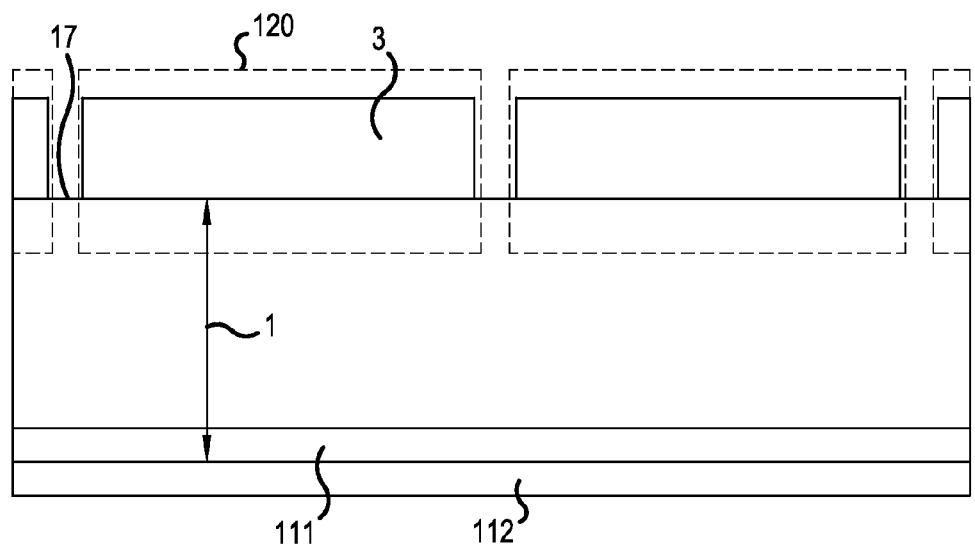
FIG. 5 is a main part manufacturing process view of the semiconductor device according to the embodiment of the invention, following FIG. 4.
Figure 12A:
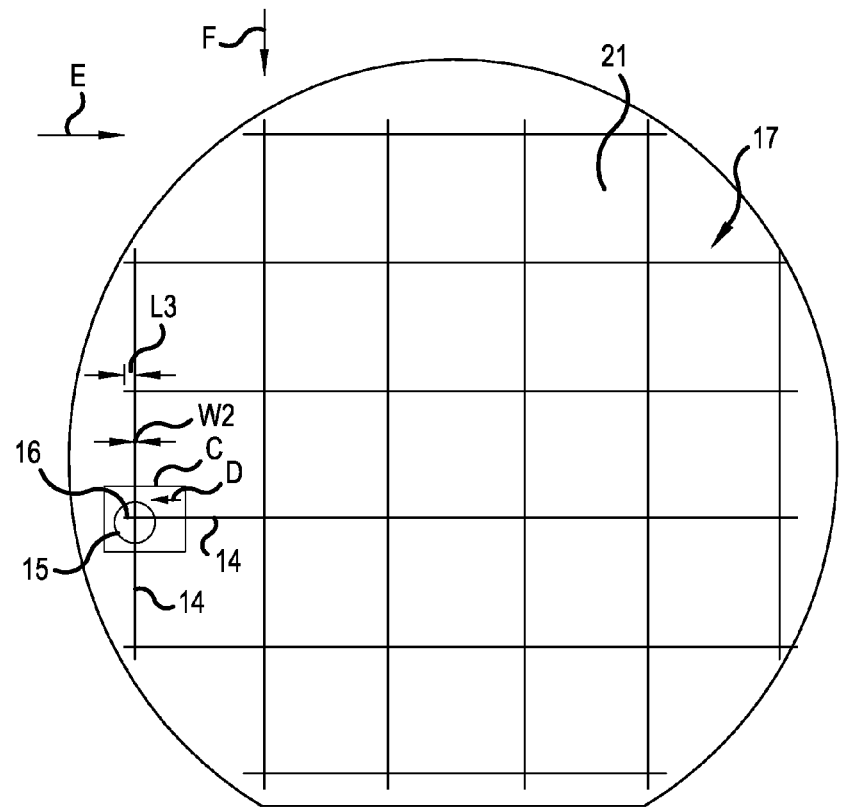
Figure 12B:
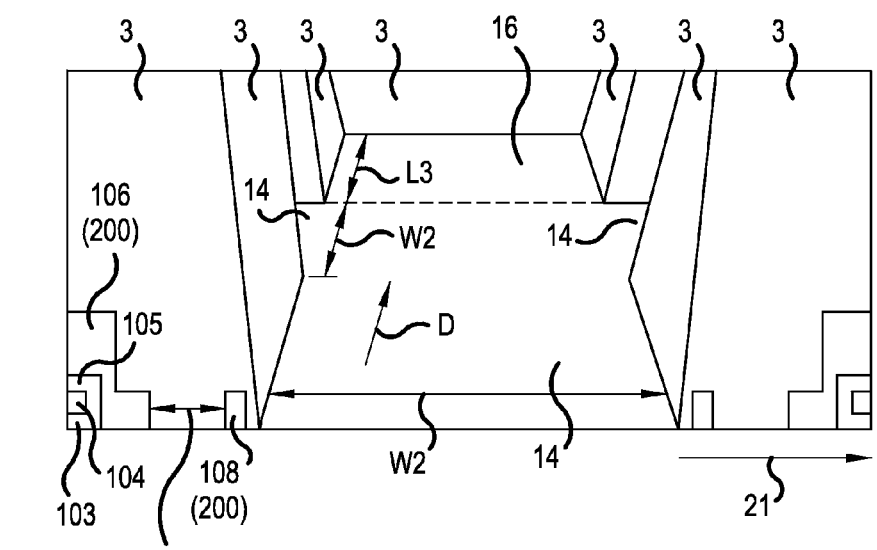

In the step of FIG. 5, surface protection film 3 is etched selectively using, as a mask, resist 4 from which the resist scribe line pattern 10 has been selectively removed. Thus, surface protection film 3 shown in FIGS. 12A and 12B is opened on a protection film scribe line pattern 17 having protrusion portions 16 extending from intersections 15 of outermost peripheral scribe lines 14 toward the outer circumference. Successively, resist 4 is removed. Protection film scribe line pattern 17 opened in surface protection film 3 is formed to be somewhat smaller than the scribe line pattern 200a of the undercoat metal film 200 shown in FIG. 9B (for example, smaller by about 10 μm, which corresponds to the distance between metal film 200 (stopper electrode 108) and surface protection film 3). Therefore, each scribe line 14 is interposed between side walls of surface protection film 3. In addition, the width W of scribe line 14 of surface protection film 3 is about 100 μm.

Figure 6:
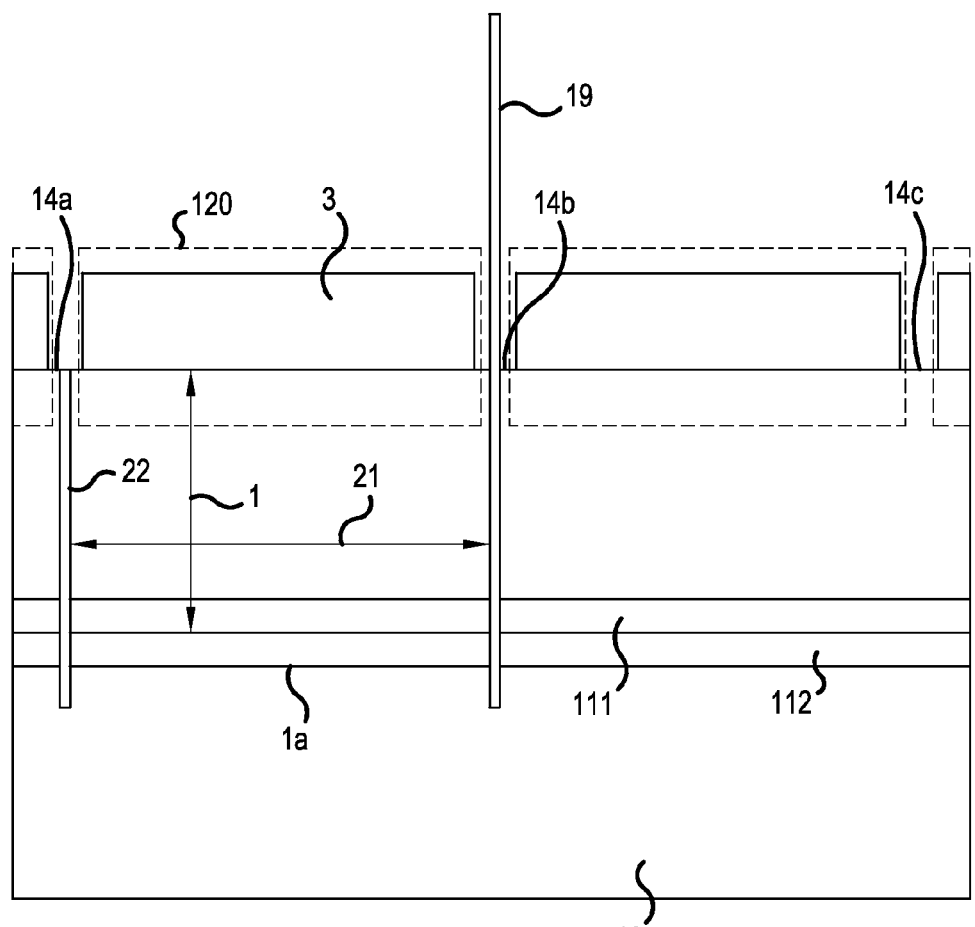
FIG. 6 is a main part manufacturing step view of the semiconductor device according to the embodiment of the invention, following FIG. 5.

In the step of FIG. 6, back surface 1a of wafer 1 is pasted to adhesive resin sheet 18. Successively, wafer 1 is cut and fragmented into dies 20 with dicing blade 19 from the front surface of wafer 1 exposed in the inside of scribe lines 14 along scribe lines 14. Side surfaces of each fragment of wafer 1 cut and fragmented thus are side surfaces of die 20 which are cut portions 22. FIG. 6 shows a state in which scribe line 14a on the left side has been cut, scribe line 14b in the middle is being cut, and scribe line 14c on the right side has not been cut.

Figure 7:
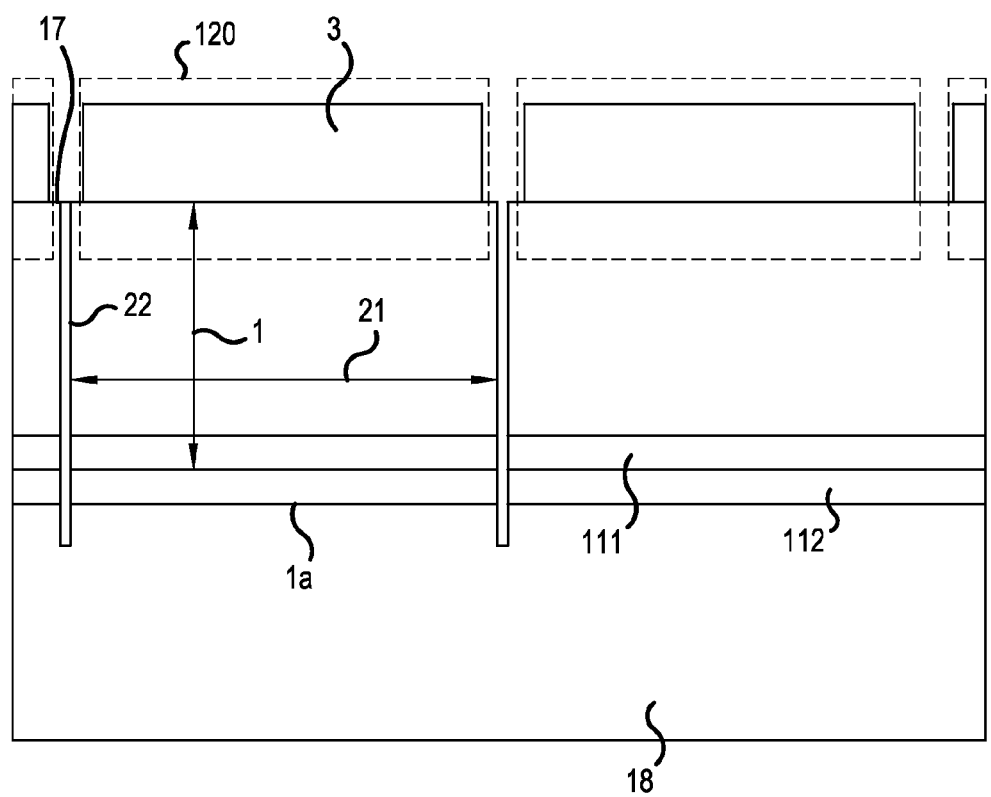
FIG. 7 is a main part manufacturing step view of the semiconductor device according to the embodiment of the invention, following FIG. 6.

In the step of FIG. 7, presence/absence of a crack (including chip) or a pattern defect in each die 20 which is pasted to sheet 18 is checked based on visual inspection so that determination is made as to whether die 20 is good or not (a good die 20a or a bad die 20b).

Figure 8:
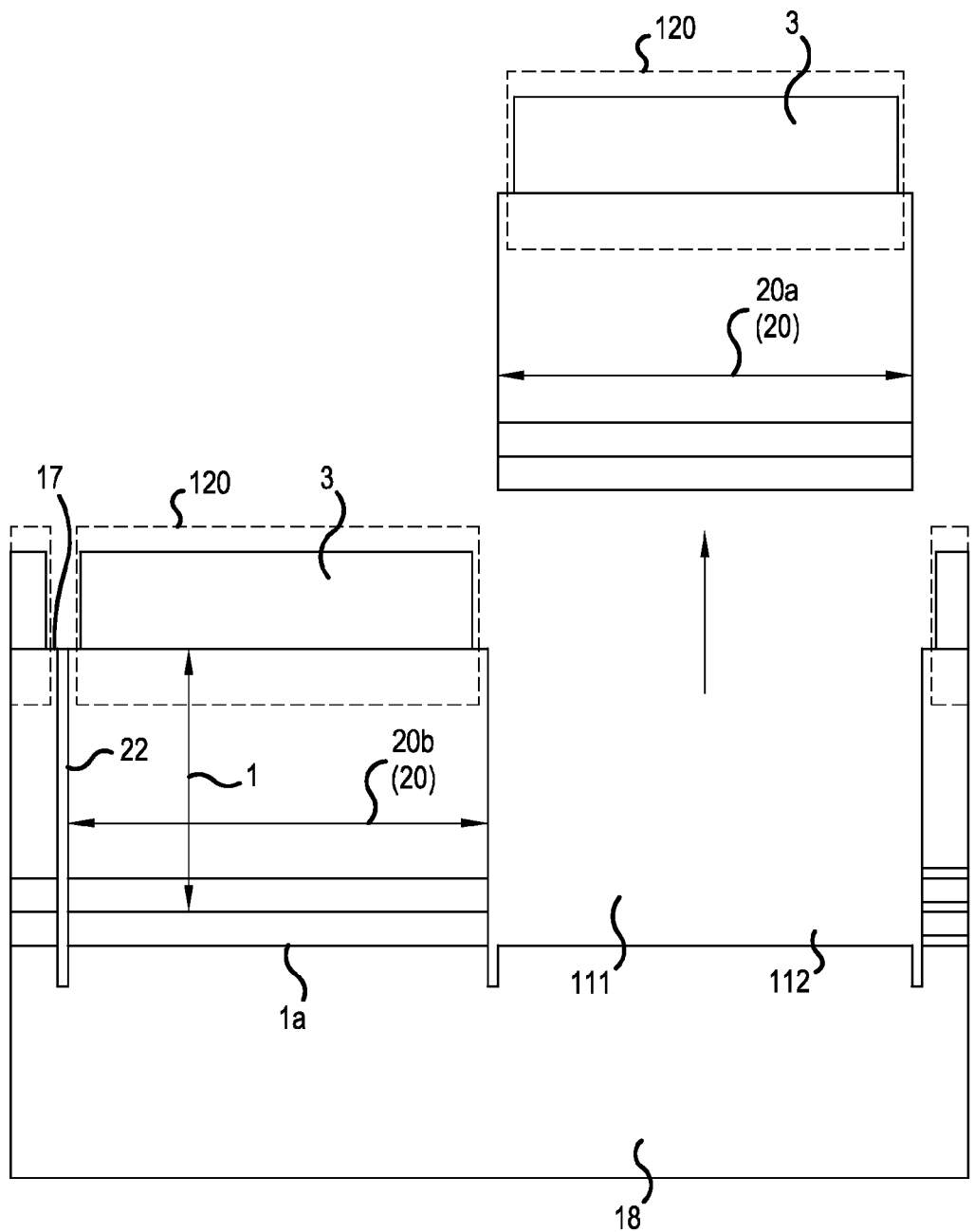
FIG. 8 is a main part manufacturing step view of the semiconductor device according to the embodiment of the invention, following FIG. 7.

In the step of FIG. 8, good die 20a is detached from sheet 18 and assembled, for example, by bonding. Then, properties of good die 20a are measured, and only the die which has matched with specifications is assembled. Thus, a semiconductor device is completed. FIG. 8 shows a state in which good die 20a has been detached.

Embodiment 2

An exposure mask according to Embodiment 2 of the invention will be described.

Figure 3:
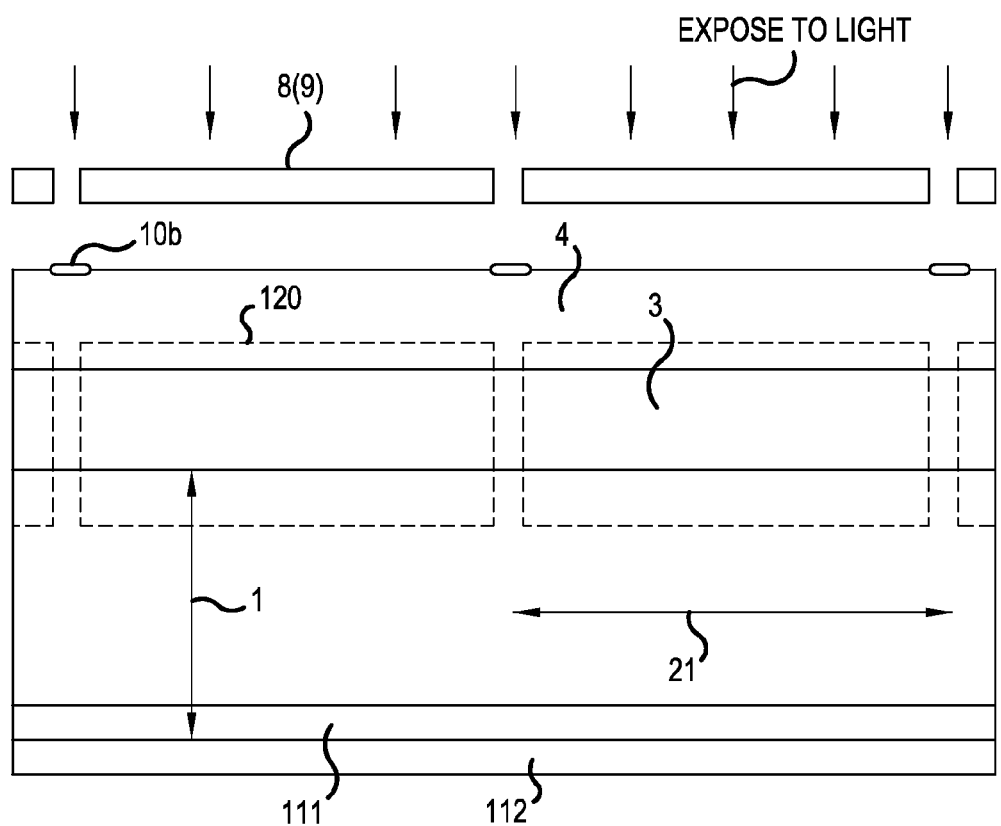
FIG. 3 is a main part manufacturing step view of the semiconductor device according to the embodiment of the invention, following FIG. 2.
Figure 10A:
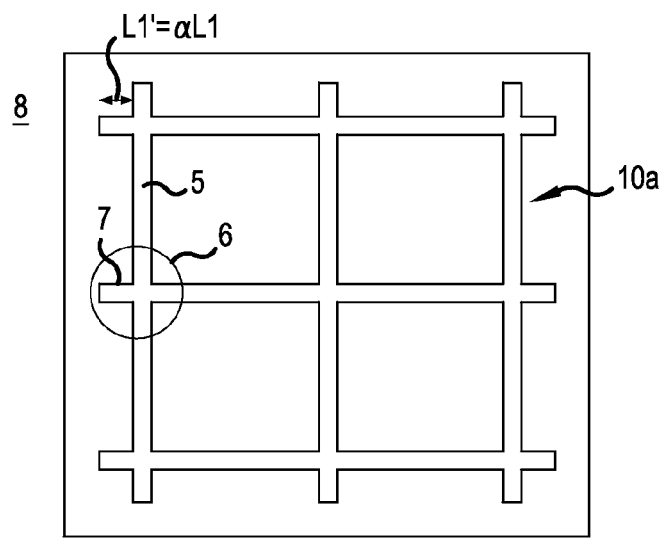
Figure 10B:
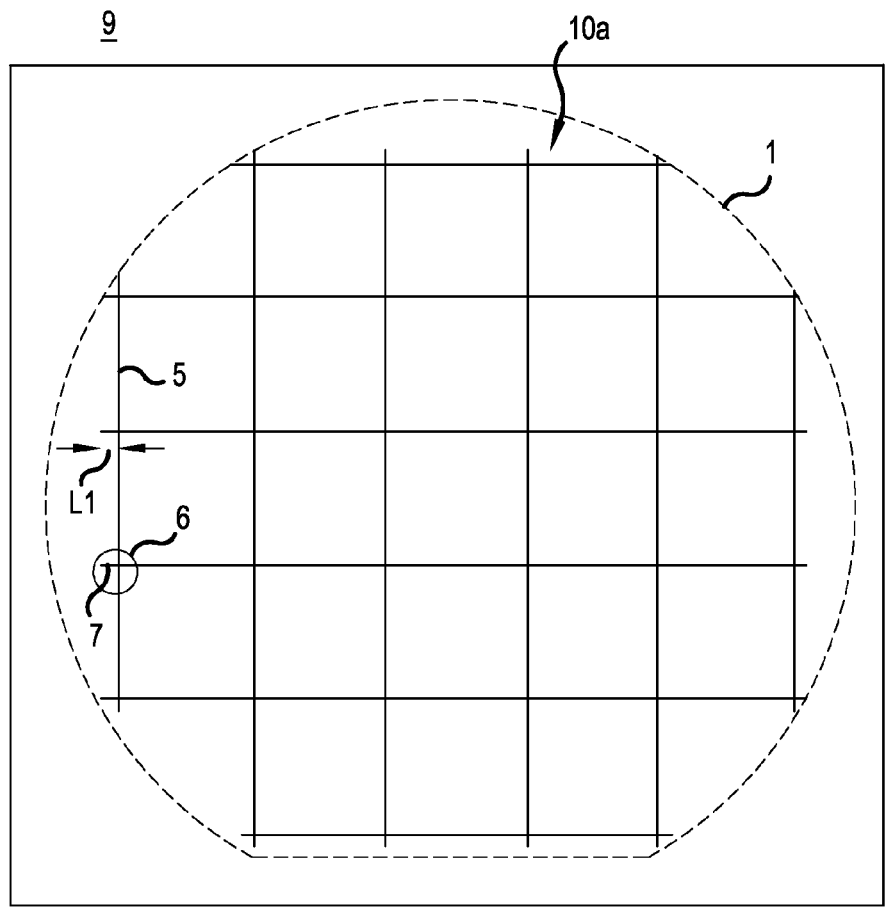

FIGS. 10A and 10B are main part plan views of the exposure mask used in the step of FIG. 3. FIG. 10A is the main part plan view of reticle 8. FIG. 10B is the main part plan view of proximity exposure mask 9. A pattern of scribe lines (scribe line pattern) and element patterns inside the scribe lines are drawn in the exposure mask shown in FIGS. 10A and 10B. Here, the element structure is generally independent of the scribe line pattern. Accordingly, description about the element pattern is omitted in the drawings.

In FIG. 10A, the scribe line pattern drawn in the exposure mask has protrusion portions 7 in which scribe lines extend from intersections 6 of outermost peripheral scribe lines toward an outer circumference. The exposure mask is set in an exposure machine (a stepper, etc.) so that resist 4 (not shown) is exposed to light in a step-and-repeat manner (repetition of shots). In this manner, resist scribe line pattern 10 is transferred to resist 4. As a result, protrusion portions 7 which protrude with the scribe lines extending from intersections 6 of scribe lines 5 on the outermost peripheral side of the wafer toward the outer circumference are formed in resist scribe line pattern 10a of resist 4.

In FIG. 10B, protrusion portions 7 protruding with scribe lines 5 extending from intersections 6 of scribe lines 5 in the outermost periphery of resist scribe line pattern 10a of proximity exposure mask 9 toward the outer circumference are formed. The pattern is transferred to and formed in resist 4 by proximity exposure. Resist scribe line pattern 10 is formed in resist 4.

The magnification of exposure/transfer of reticle 8 may take a value of two or five by way of example. Accordingly, the length of each protrusion portion 7 drawn in reticle 8 may be set as a length obtained by multiplying a desired length on the wafer by the magnification of the reticle.

Protrusion portions 7 extending from intersections 6 of the outermost peripheral scribe lines 5 toward the outer circumference are provided in both the exposure masks, that is, reticle 8 and proximity exposure mask 9. The length L1' of each protrusion portion 7 in the exposure mask is set as a length obtained by multiplying the length L1 of protrusion portion 7 on the wafer by the magnification a of the exposure mask. That is, L1'=L1 in α which α=2, 5, etc. In the following description, when there is no particular note, the length of protrusion portion 7 is set as the length L1 on the wafer. The length L1 of protrusion portion 7 may be set to be not shorter than 100 μm, preferably to be not shorter than 100 μm and not longer than 500 μm. Detailed description about the length L1 of protrusion portion 7 will be made later.

FIGS. 11A and 11B are views in which resist scribe line pattern 10 has been formed in resist 4 on wafer 1 in the step of FIG. 4. FIG. 11A is a main part plan view. FIG. 11B is a main part perspective view of a portion A in FIG. 11A, which is viewed from the direction of an arrow B. When reticle 8 and proximity exposure mask 9 are used, protrusion portions 13 extending toward the outer circumference are formed in intersections 12 of outermost peripheral scribe lines 11. Assume that the length of each of protrusion portions 13 is L2. There is almost no error in the length due to the exposure. Accordingly, the length of protrusion portion 13 may be regarded as equal to the length L1. This length L2 may be set to be not shorter than 100 μm, preferably to be not shorter than 100 μm and not longer than 500 μm.

Incidentally, the length L2 is the length on the assumption that side etching does not occur when resist scribe line pattern 10 formed in resist 4 by exposure is removed by development. The side etching means the length of the amount of retreat with which an end portion of surface protection film 3, for example, retreats on the inner side of a scribe line in comparison with an end portion of the scribe line pattern on the exposure mask. Incidentally, in the development of the exposed resist 4, it may be conceived that the side etching does not occur. In addition, the width W1 of each scribe line 11 is also equal to the width of each protrusion portion 13.

FIGS. 12A and 12B are views in which protection film scribe line pattern 17 is formed in surface protection film 3 on wafer 1 in the step of FIG. 5. FIG. 12A is a main part plan view. FIG. 12B is a main part perspective view of a portion C in FIG. 12A, which is viewed from the direction of an arrow D. Protrusion portions 16 protruding from intersections 15 of the outermost peripheral scribe lines 14 toward the outer circumference are formed in protection film scribe line pattern 17 formed in surface protection film 3 (also including the undercoat metal film 200). Assume that the length of each protrusion portion 16 is L3.

Surface protection film 3 is selectively etched using, as a mask, resist 4 in which resist scribe line pattern 10 has been formed. In this case, an end portion of surface protection film 3 is side-etched. Therefore, the opening width W2 of surface protection film 3 etched is larger than the opening width W1 of resist scribe line pattern 10 by twice of a single-side etching quantity D of surface protection film 3.

When side etching occurs in the etching for forming protection film scribe line pattern 17, the lengths L1 and L1' are set so that the length L3 of each protrusion portion 16 of protection film scribe line pattern 17 of surface protection film 3 can be put in the aforementioned range. That is, the relation L1=L3+D is established. The L3 may be set to be not shorter than 100 μm, preferably to be not shorter than 100 μm and not longer than 500 μm.

In addition, surface element structure 120 including metal film 200 in FIG. 9A is formed in device formation section 21.

Figure 13:
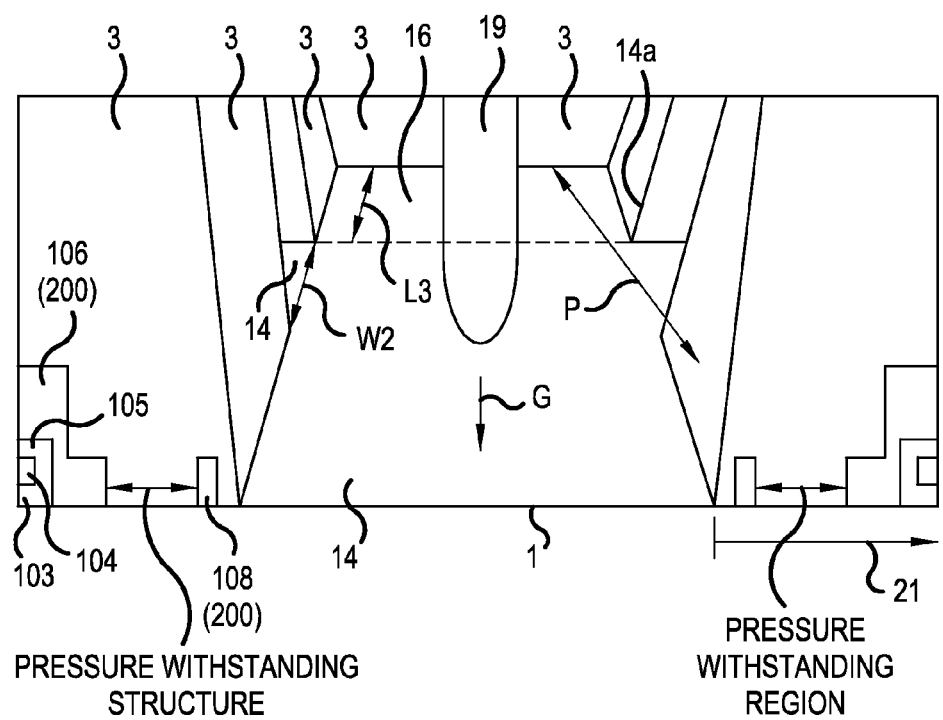
FIG. 13 is a main part perspective view in which wafer 1 is cut along scribe line 14 (in the direction of an arrow G) with dicing blade 19 in the step of FIG. 6.

FIG. 13 is a main part perspective view in which wafer 1 is cut with dicing blade 19 along scribe line 14 (in the direction of an arrow G) in the step of FIG. 6.

A front end portion of the dicing blade 19 is located on scribe line 14. Protrusion portion 16 having the length L3 is provided to protrude from intersection 15 of scribe lines 14 toward the outer circumference. In this manner, it is possible to reduce the probability of occurrence of a crack propagated in a wide range over surface protection film 3 and further over the wafer under surface protection film 3. The diameter of dicing blade 19 used for cutting wafer 1 is, for example, about 3 cm to 6 cm.

When protrusion portion 16 is provided as described above, a distance P between a place where dicing blade 19 touches surface protection film 3 (including the undercoat metal film made of an aluminum silicon alloy) and device formation section 21 can be increased. In this manner, occurrence of a crack, and propagation of the crack to device formation section 21 can be suppressed.

When the width W of scribe line 14 is set to be 100 μm, the thickness of the surface protection film is about 10 μm and the thickness of the metal film is about several μm. The length L3 of protrusion portion 16 (the length from outer end portion 14a of the outermost peripheral scribe line 14) is set to be about 100 μm to 500 μm. In this manner, when the thickness of wafer 1 is in the range of from about 100 μm to about 300 μm, the probability of occurrence of a crack can be reduced largely (to the estimated order of ppm). When the length L3 is shorter than 100 μm, it is difficult to reduce the probability of occurrence of a crack to the order of ppm. In addition, as the length L3 increases, the probability of occurrence of a crack decreases preferably but the following disadvantage arises.

Figure 14:
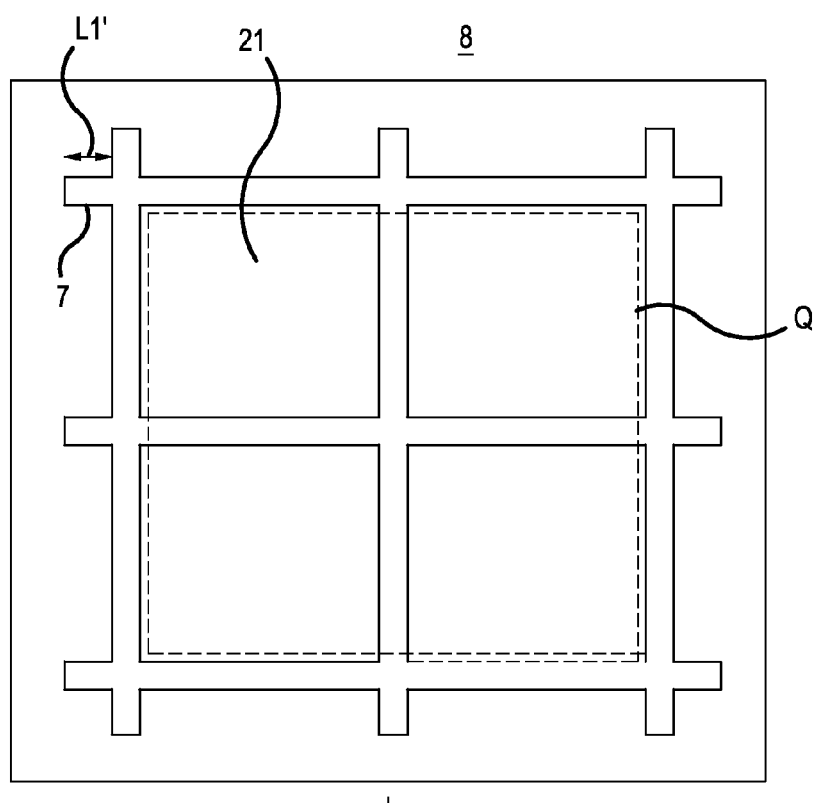
Figure 14B:
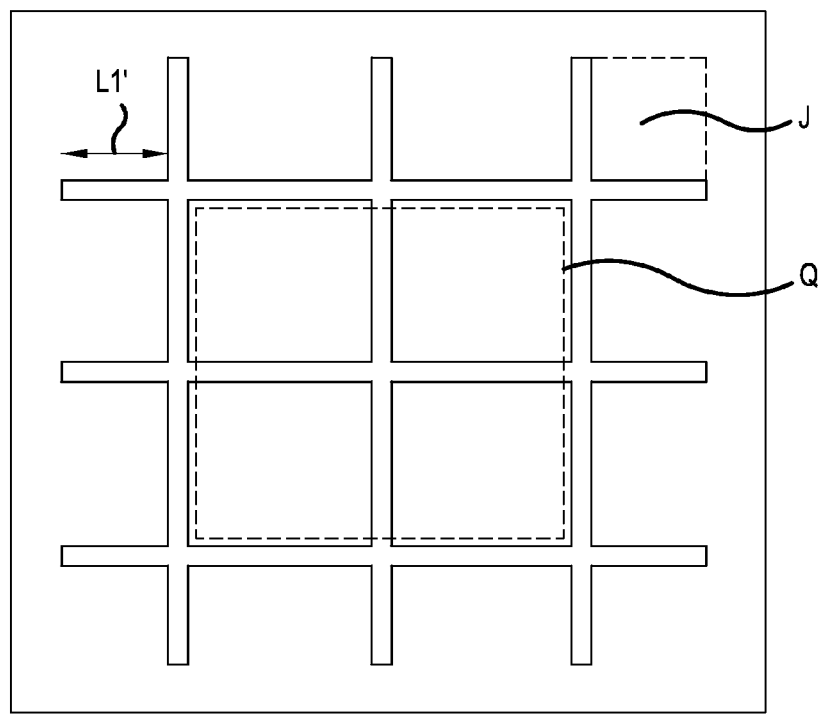

When the length L3 of the protrusion portion is too large in the case of reticle 8 as shown in FIGS. 14A and 14B, an effective region Q in which device formation sections 21 are integrated decreases. Therefore, it is necessary to reduce the size of die 20, and it is difficult to form a large die. When the die is made small and the number of dies placed in one shot is reduced, the number of shots increases. In addition, when die 20 has the same size, a portion J of the length L1 of each protrusion portion 7 of the exposure mask becomes a dead space (although only one portion J is illustrated in FIG. 14B, the whole surrounding region is the dead space). Therefore, it is necessary to reduce the number of dies disposed in reticle 8. Thus, the number of shots for exposing wafer 1 to light increases. For this reason, the length L1 of protrusion portion 7 may be set to be not longer than 500 μm in the case of reticle 8.

Figure 15:
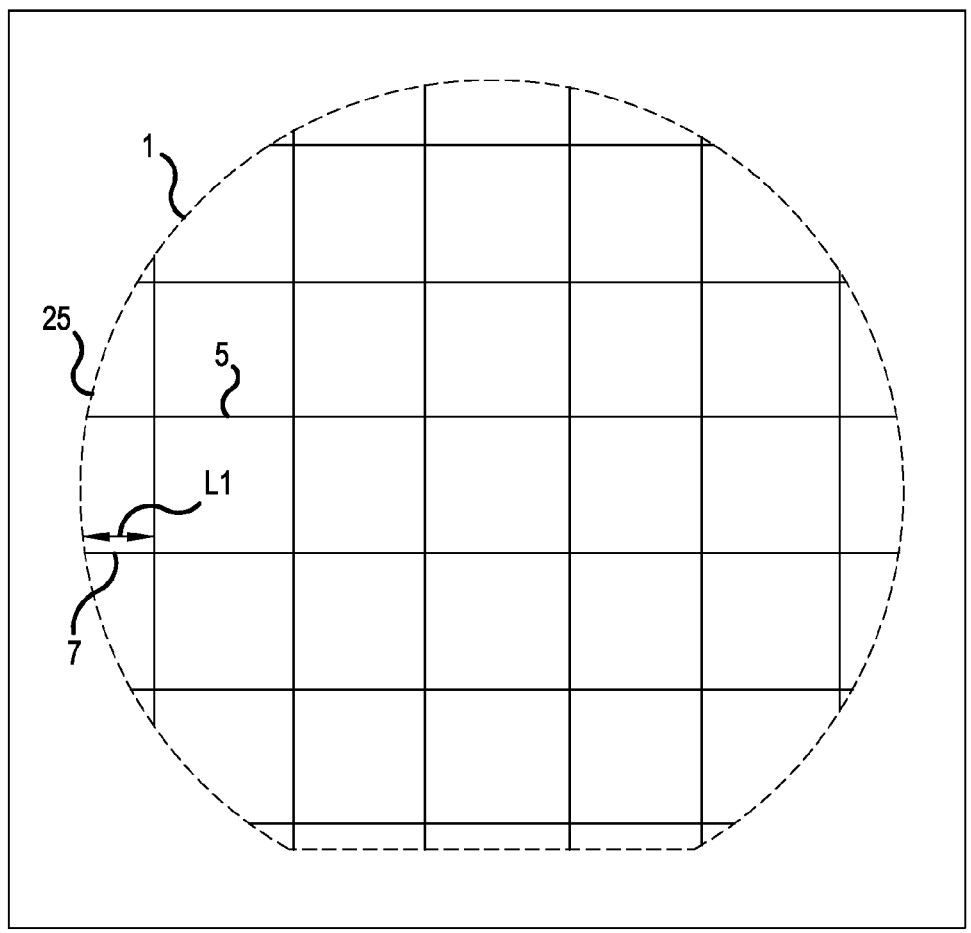
FIG. 15 is a view in the case where the length L3 of each protrusion portion in a scribe line pattern of proximity exposure mask 9 is extended to an outer circumferential end of wafer 1.
Figure 16:
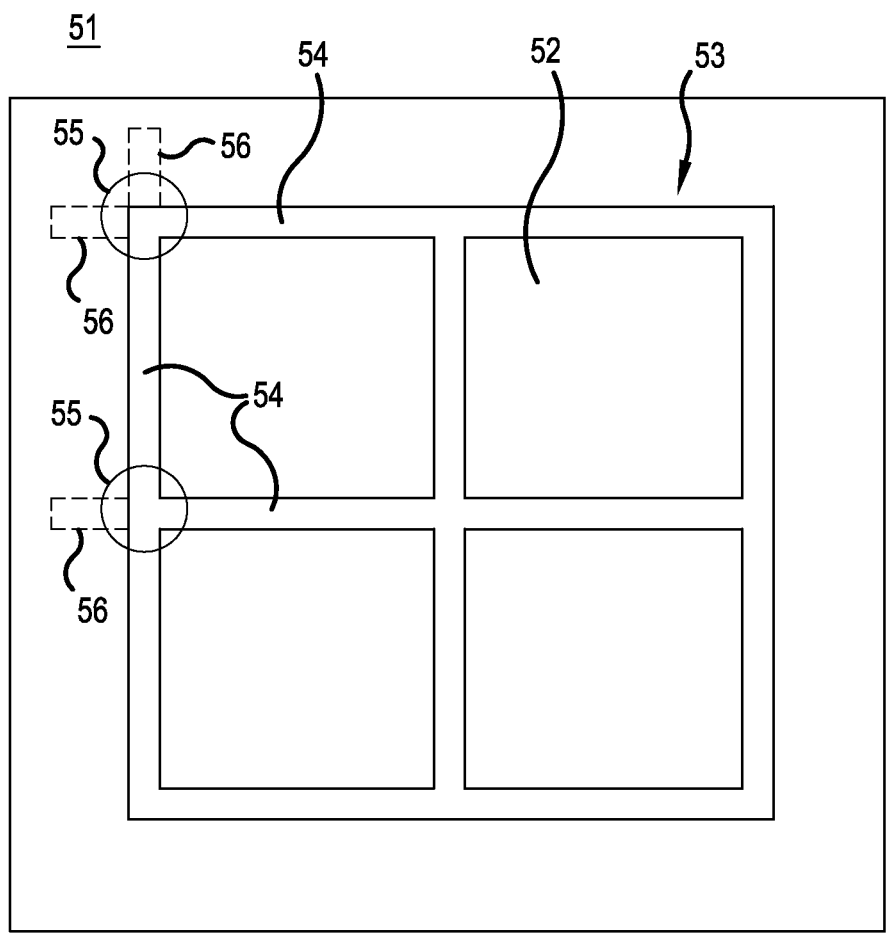
FIG. 16 is a main part plan view of a background-art reticle 51 for forming scribe lines.
Figure 17:
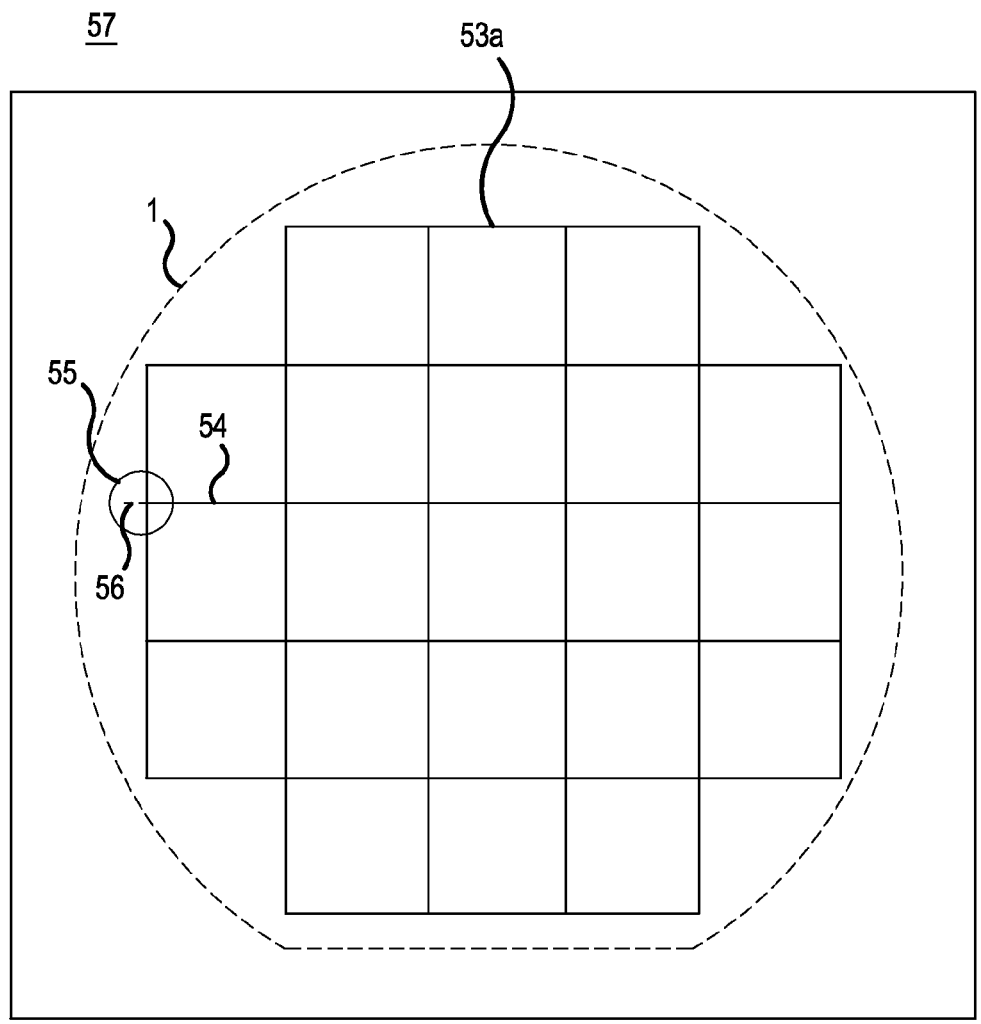
FIG. 17 is a main part plan view of a background-art proximity exposure mask 57 for forming scribe lines.
Figure 18:
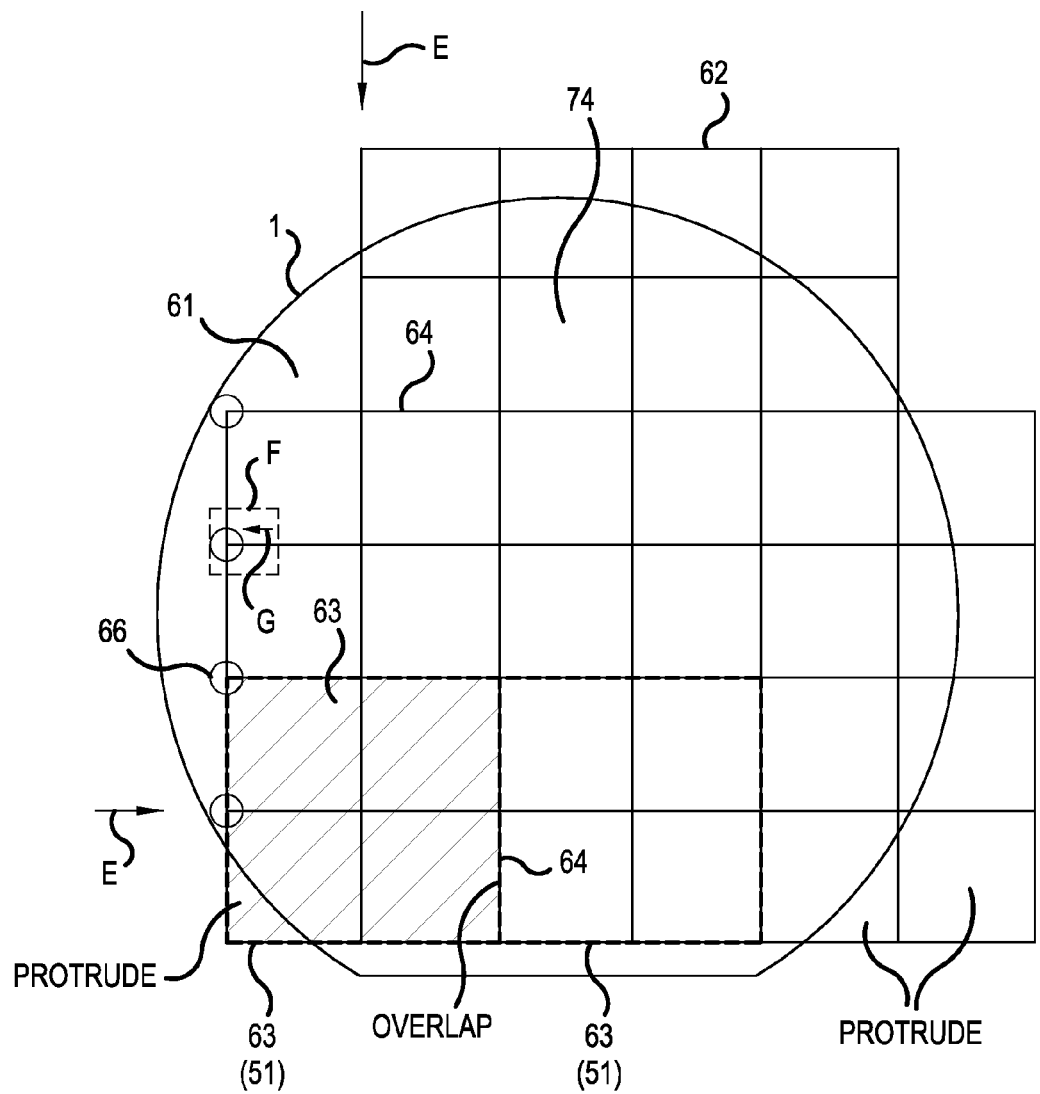
FIG. 18 is a plan view of scribe line pattern 62 when resist 61 on wafer 1 is exposed to light by use of reticle 51.
Figure 19:
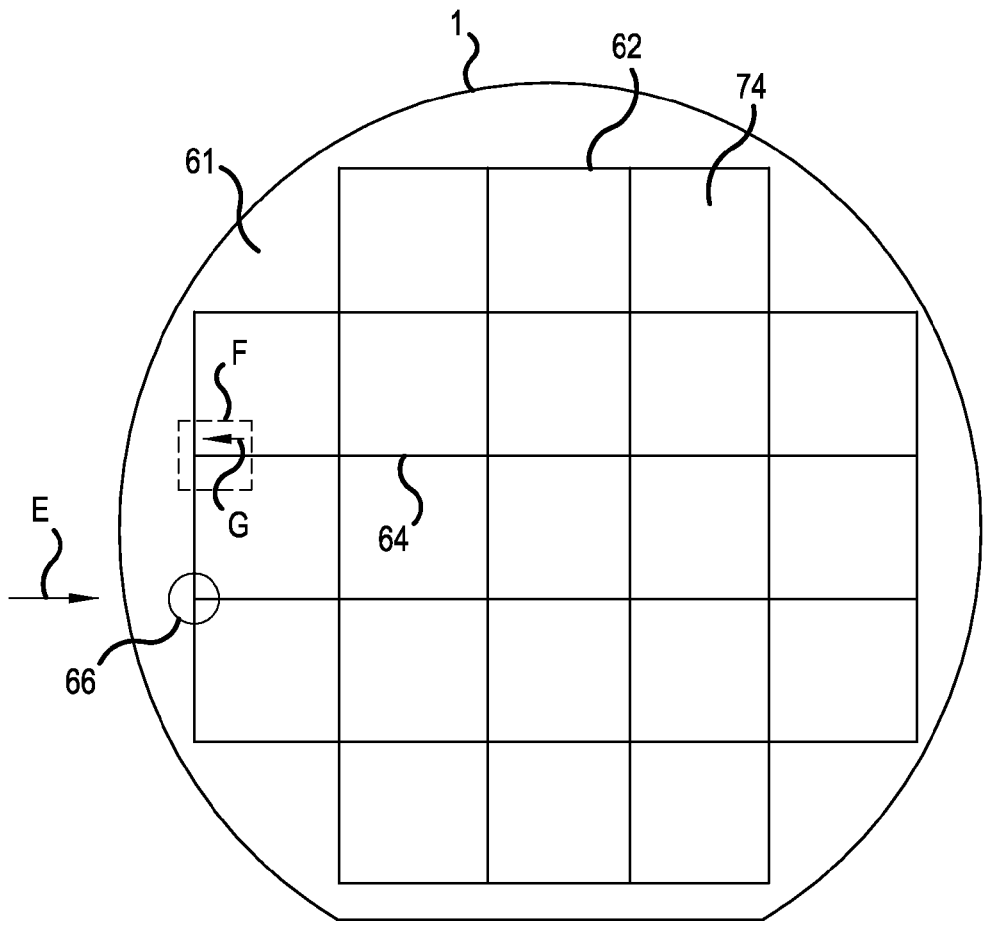
FIG. 19 is a plan view of scribe line pattern 62 when resist 61 on wafer 1 is exposed to light by use of proximity exposure mask 57.
Figure 20:
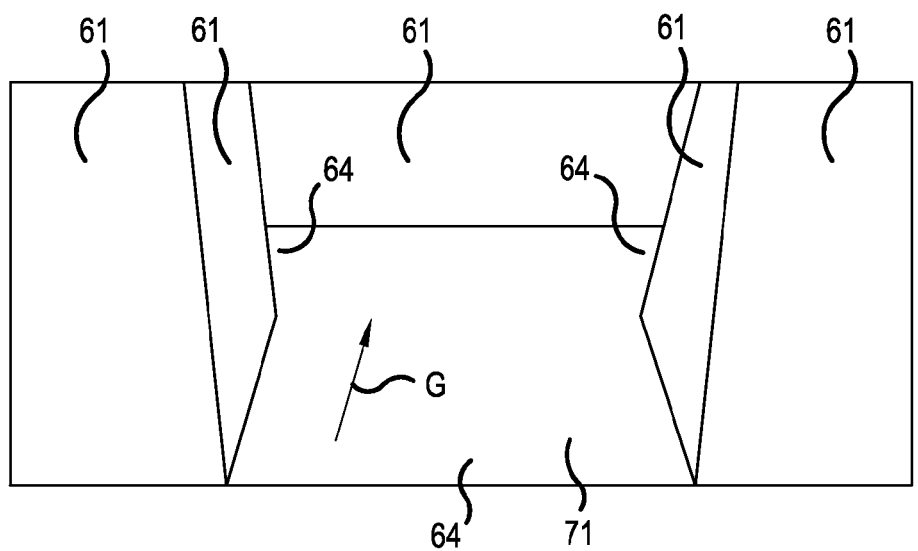
FIG. 20 is a main part perspective view in which a portion F of scribe line pattern 62 formed in resist 61 in FIG. 18
Figure 21:
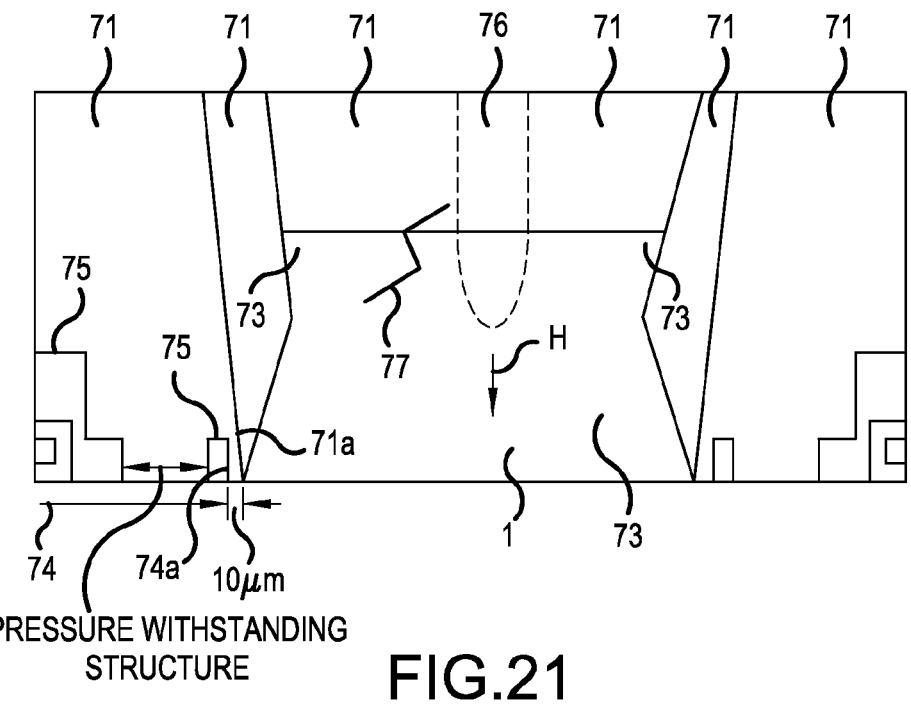
FIG. 21 is a main part perspective view of scribe line pattern 72 of surface protection film 71 formed by use of scribe line pattern 62 of resist 61 in FIG. 18 or FIG. 19.
Figure 22:
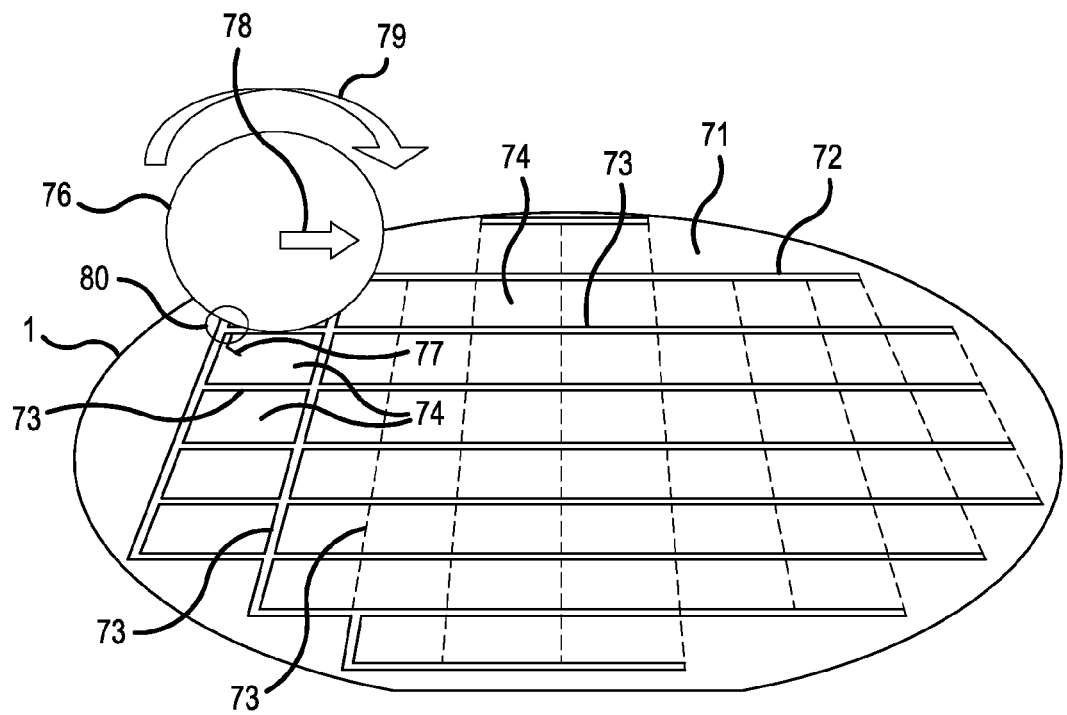
FIG. 22 is a main part perspective view showing a state in which wafer 1 is cut along scribe line 73 with dicing blade 76.
Figure 23A:
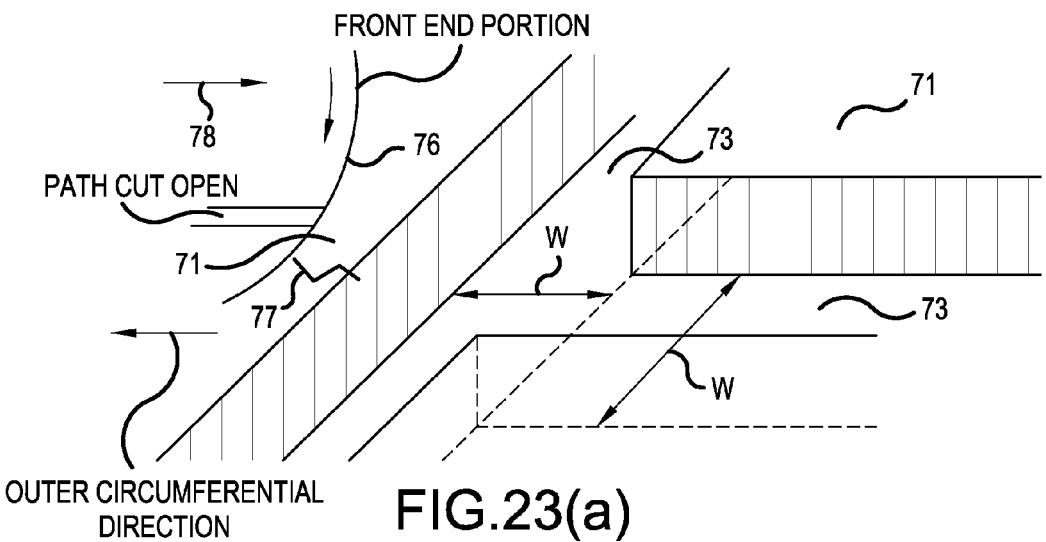
Figure 23B:
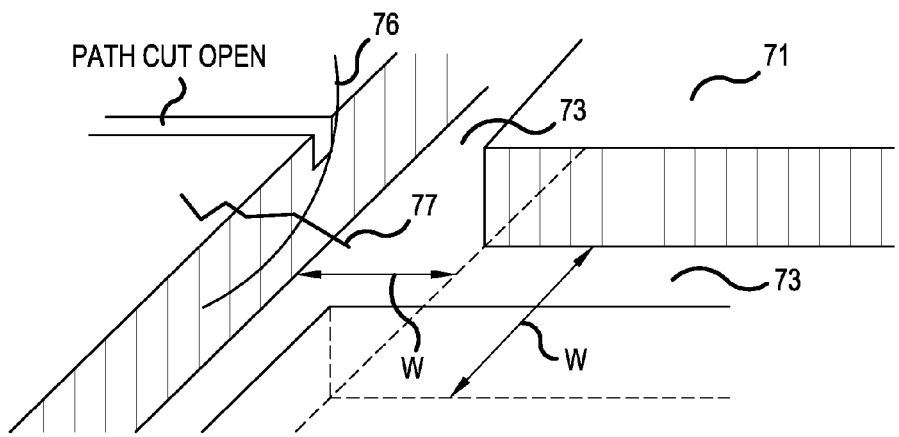
Figure 23C:
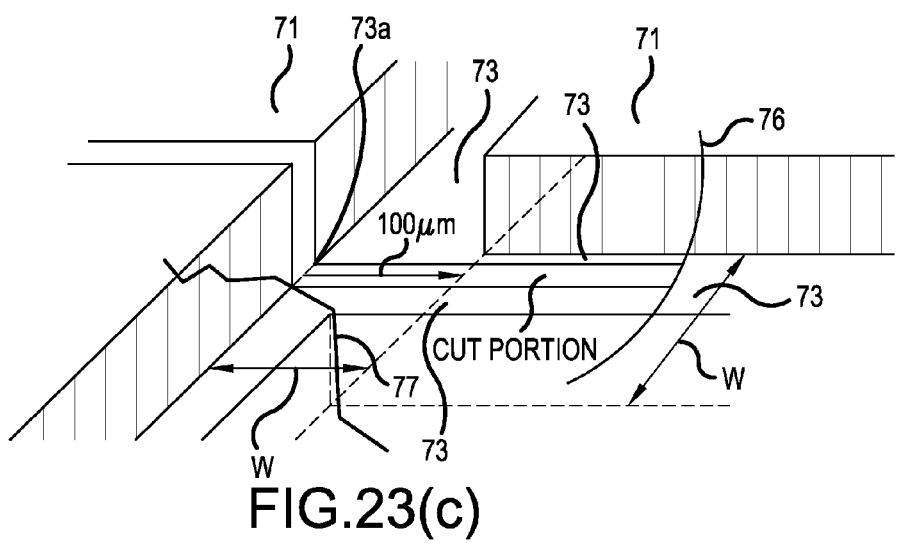
Figure 24:
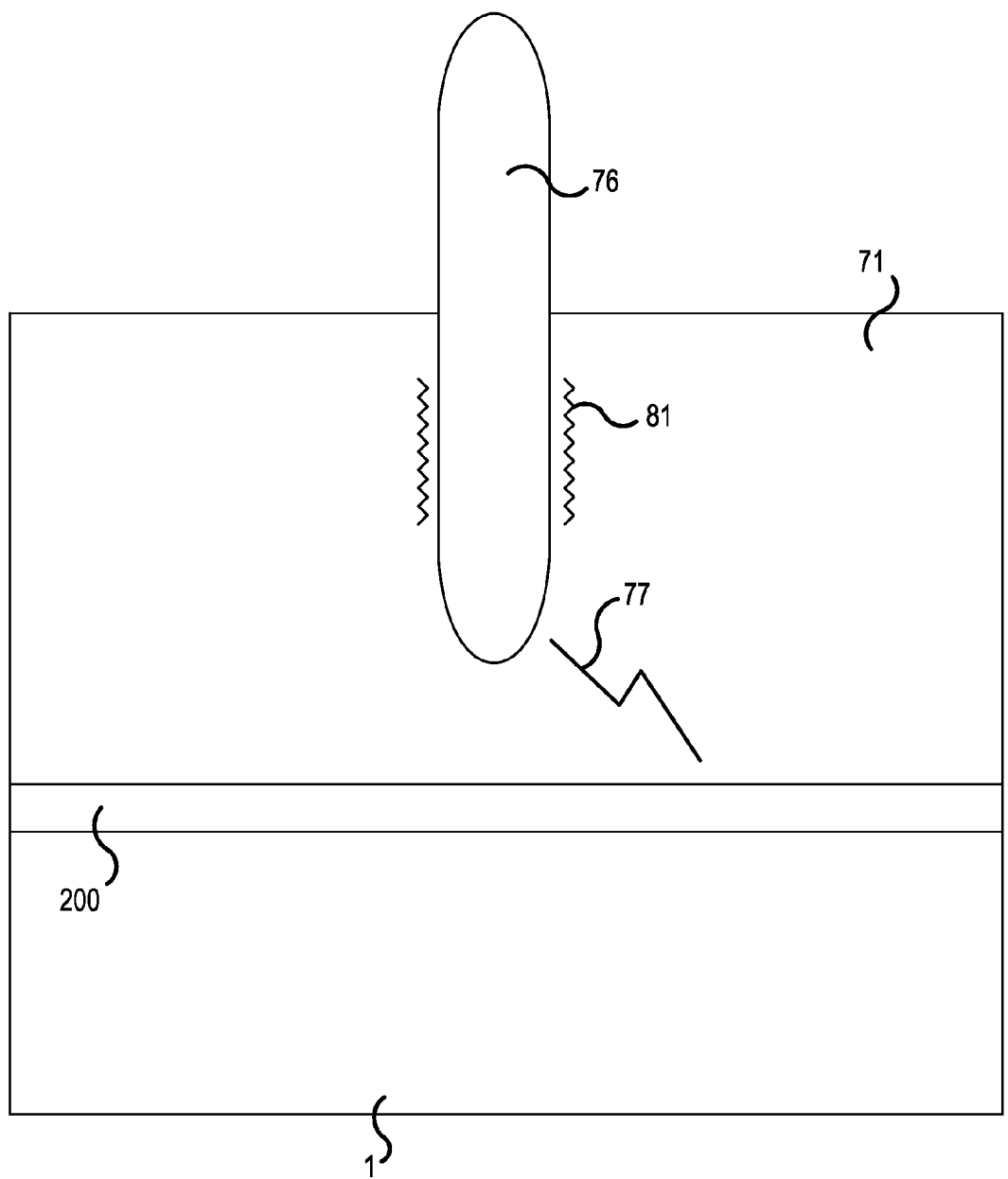
FIG. 24 is a view showing a state in which surface protection film 71 is cut with the dicing blade.
Figure 25:
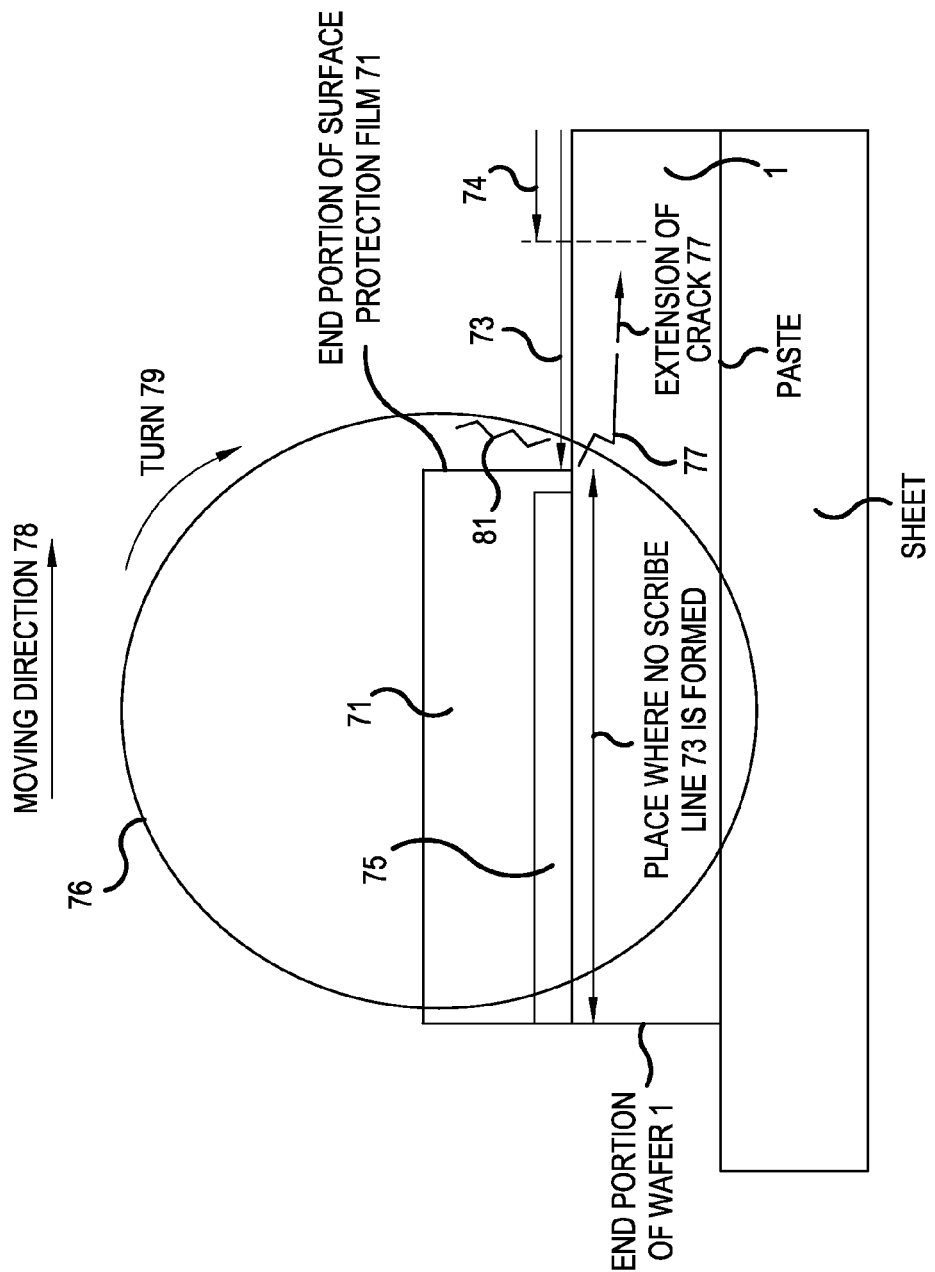
FIG. 25 is a main part sectional view showing a state in which wafer 1 is cut with dicing blade 76 which moves to pass through surface protection film 71 and undercoat metal film 75 in an outer circumferential portion of wafer 1 where no scribe line 73 is formed.
Figure 26:
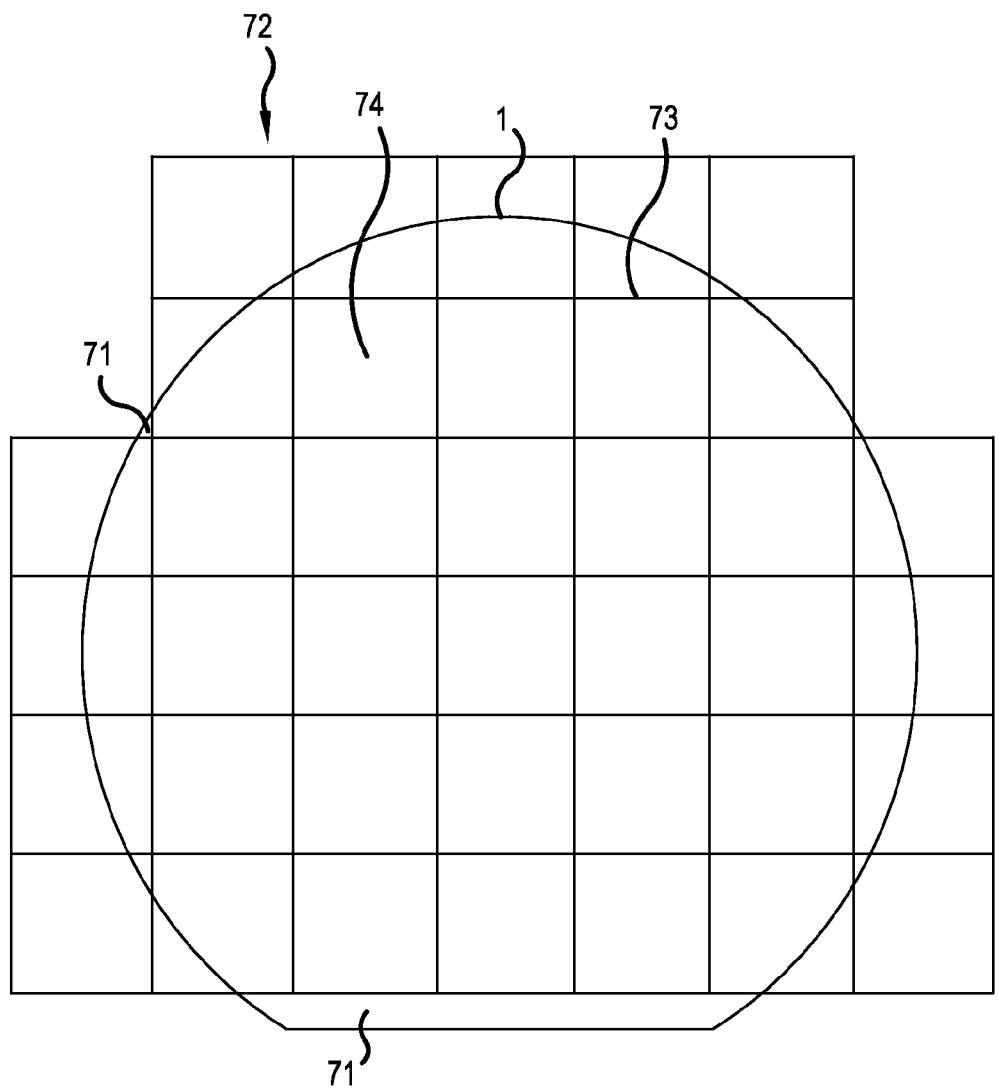
FIG. 26 is a view showing a state in which wafer 1 is moved to be exposed to light up to its outer circumference by use of reticle 51.

On the other hand, proximity exposure mask 9 has no limitation as appears in reticle 8. Accordingly, the length L1 of protrusion portion 7 may be set to be not shorter than 500 μm. In the extreme case, protrusion portion 7 may be extended up to the vicinity of end portion 25 of wafer 1 as shown in FIG. 15.

When protrusion portions 16 are provided in protection film scribe line pattern 17 of surface protection film 3 as described above, the probability of occurrence of a crack occurring at the time of cutting wafer 1 can be reduced so that the manufacturing cost of the semiconductor device can be reduced.

Incidentally, the largest influence on the probability of occurrence of a crack is the length L3 of the protrusion portion 16 of protection film scribe line pattern 17. When the thickness of surface protection film 3 and the thickness of metal film 200 are formed in a normal range, the influence is small.

Thus, a method for manufacturing a semiconductor device and an exposure mask used in the method have been described according to the present invention. Many modifications and variations may be made to the techniques and structures described and illustrated herein without departing from the spirit and scope of the invention. Accordingly, it should be understood that the methods and apparatus described herein are illustrative only and are not limiting upon the scope of the invention.

What is claimed is:

1. An exposure mask comprising a scribe line pattern, wherein the scribe line pattern has protrusion portions each extending further on the outer circumferential side of an intersection of two scribe lines in an outermost periphery of the scribe line pattern, wherein the length of each of the protrusion portions is greater than or equal to 100 μm times the magnification of the mask.

2. An exposure mask according to claim 1, wherein the length of each of the protrusion portions is less than or equal to 500 μm times the magnification of the mask.

3. An exposure mask according to claim 1, wherein the exposure mask is a reticle or a proximity exposure mask.

* * * * *